(12) United States Patent
Myers et al.

(10) Patent No.: US 9,209,077 B2
(45) Date of Patent: Dec. 8, 2015

(54) DIAGONAL HARDMASKS FOR IMPROVED OVERLAY IN FABRICATING BACK END OF LINE (BEOL) INTERCONNECTS

(71) Applicants: Alan M. Myers, Beaverton, OR (US); Kanwal Jit Singh, Hillsboro, OR (US); Robert L. Bristol, Portland, OR (US); Jasmeet S. Chawla, Hillsboro, OR (US)

(72) Inventors: Alan M. Myers, Beaverton, OR (US); Kanwal Jit Singh, Hillsboro, OR (US); Robert L. Bristol, Portland, OR (US); Jasmeet S. Chawla, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 14/137,588

(22) Filed: Dec. 20, 2013

(65) Prior Publication Data

US 2015/0179513 A1 Jun. 25, 2015

(51) Int. Cl.
*H01L 21/768* (2006.01)
*H01L 21/033* (2006.01)
*H01L 21/311* (2006.01)
*H01L 23/522* (2006.01)
*H01L 23/528* (2006.01)

(52) U.S. Cl.
CPC ...... *H01L 21/76879* (2013.01); *H01L 21/0337* (2013.01); *H01L 21/31144* (2013.01); *H01L 21/76883* (2013.01); *H01L 23/528* (2013.01); *H01L 23/5226* (2013.01)

(58) Field of Classification Search
CPC .................. H01L 21/0337; H01L 21/0331
USPC ....................................................... 257/774
See application file for complete search history.

(56) References Cited

U.S. PATENT DOCUMENTS

| | | | |
|---|---|---|---|
| 8,647,981 B1* | 2/2014 | Sipani | 438/675 |
| 2009/0200683 A1 | 8/2009 | Colburn et al. | |
| 2010/0081395 A1 | 4/2010 | Woo et al. | |
| 2012/0045896 A1* | 2/2012 | Sipani et al. | 438/675 |
| 2012/0175733 A1 | 7/2012 | Kastenmeier | |
| 2013/0043509 A1 | 2/2013 | Cho et al. | |
| 2013/0260559 A1* | 10/2013 | Park et al. | 438/694 |

OTHER PUBLICATIONS

International Search Report and Written Opinion from PCT/US2014/064156 mailed Feb. 16, 2015, 12 pgs.

* cited by examiner

*Primary Examiner* — Lex Malsawma
*Assistant Examiner* — Patricia Reddington
(74) *Attorney, Agent, or Firm* — Blakely, Sokoloff, Taylor & Zafman LLP

(57) ABSTRACT

Self-aligned via and plug patterning using diagonal hardmasks for improved overlay in fabricating back end of line (BEOL) interconnects is described. In an example, a method of fabricating an interconnect structure for an integrated circuit involves forming a first hardmask layer above an interlayer dielectric layer disposed above a substrate. The first hardmask layer includes a plurality of first hardmask lines having a first grating in a first direction and comprising one or more sacrificial materials interleaved with the first grating. The method also involves forming a second hardmask layer above the first hardmask layer. The second hardmask layer includes a plurality of second hardmask lines having a second grating in a second direction, diagonal to the first direction. The method also involves, using the second hardmask layer as a mask, etching the first hardmask layer to form a patterned first hardmask layer. The etching involves removing a portion of the one or more sacrificial materials.

17 Claims, 20 Drawing Sheets

PLAIN VIEW

CROSS-SECTIONAL VIEW

PLAIN VIEW

CROSS-SECTIONAL VIEW

PLAIN VIEW

CROSS-SECTIONAL VIEW

PLAIN VIEW

CROSS-SECTIONAL VIEW

PLAIN VIEW

CROSS-SECTIONAL VIEW

PLAIN VIEW

CROSS-SECTIONAL VIEW

PLAIN VIEW

CROSS-SECTIONAL VIEW

DIAGONAL HARDMASKS FOR IMPROVED OVERLAY IN FABRICATING BACK END OF LINE (BEOL) INTERCONNECTS

TECHNICAL FIELD

Embodiments of the invention are in the field of semiconductor structures and processing and, in particular, diagonal hardmasks for improved overlay in fabricating back end of line (BEOL) interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIG. 1A illustrates a cross-sectional view of a starting structure following deposition, but prior to patterning, of a hardmask material layer formed on an interlayer dielectric (ILD) layer;

FIG. 1X illustrates a plan view and corresponding first cross-sectional view (taken along the l-l' axis) and second cross-sectional view (taken along the m-m' axis) of the structure of FIG. 1W following removal of remaining fourth photobuckets, hardmask material layer and sacrificial material, and subsequent metal fill.

DESCRIPTION OF THE EMBODIMENTS

Figure 1A:
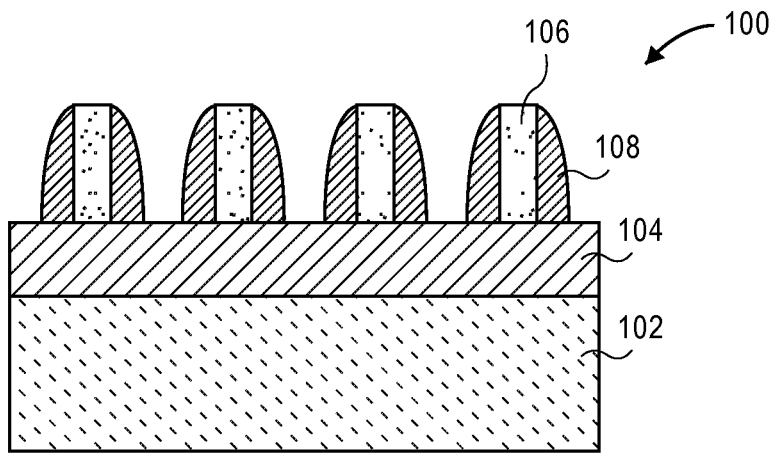
FIGS. 1A-1X illustrate portions of integrated circuit layers representing various operations in a method of self-aligned via and plug patterning using diagonal hardmasks, in accordance with an embodiment of the present invention, where.

Self-aligned via and plug patterning using diagonal hardmasks for improved overlay in fabricating back end of line (BEOL) interconnects is described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to diagonal hardmask patterning for overlay improvements, particularly in the fabrication of back end of line (BEOL) features for semiconductor integrated circuits. Applications of patterning based on diagonal hardmasks may include, but need not be limited to, implementation in 193 nm immersion lithography, extreme ultraviolet (EUV) lithography, interconnect fabrication, overlay improvements, overlay budget, plug patterning, via patterning. Embodiments may be particularly useful for the self-aligned fabrication of BEOL structures at the 7 nm node or smaller.

In an embodiment, approaches described herein involve an integration scheme that tolerates increased via and plug overlay margin relative to existing approaches. In one such embodiment, all potential vias and plugs are pre-patterned and filled with resist. Subsequently, in a specific embodiment, EUV or 193 nm lithography is used to select certain of the via and plug locations for actual, ultimate, via and plug fabrication. In an embodiment, diagonal line patterning is used to increase nearest-neighbor distances resulting in an increase by a factor of the square root of two in overlay budget.

More generally, one or more embodiments described herein are directed to subtractive approaches for self-aligned via and plug patterning, and structure resulting there from. In an embodiment, processes described herein enable realization of self-aligned metallization for back-end of line feature fabrication. Overlay problems anticipated for next generation via and plug patterning may be addressed by one or more approaches described herein.

To provide context, current fabrication techniques for vias involves a "blind" process in which a via opening is patterned in a stack far above an ILD trench. The via opening pattern is then etched deep down into the trench. Overlay errors accumulate and can cause various problems, e.g., shorts to neighboring metal lines. In an example, patterning and aligning of features at less than approximately 50 nanometer pitch requires many reticles and critical alignment strategies that are otherwise extremely expensive for a semiconductor manufacturing process. In an embodiment, by contrast, approaches described herein enable fabrication of self-aligned plugs and/or vias, greatly simplifying the web of overlay errors, and leaving only one critical overlay step (Mx+1 grating). In an embodiment, then, offset due to conventional lithograph/dual damascene patterning that must otherwise be tolerated, is not a factor for the resulting structures described herein.

In general, one or more embodiments are directed to an approach that employs a subtractive technique to form conductive vias and non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/ exposures, can be used to improve electrical contact (e.g., by reducing via resistance), and can be used to reduce total process operations and processing time otherwise required for patterning such features using conventional approaches.

More specifically, one or more embodiment described herein involves the use of a subtractive method to pre-form every via and plug using the trenches already etched. An additional operation is then used to select which of the vias and plugs to retain. Such operations can be illustrated using "photobuckets," although the selection process may also be performed using a more conventional resist expose and ILD backfill approach.

In an aspect, a diagonal hardmask approach may be implemented. As an example, FIGS. 1A-1X illustrate portions of integrated circuit layers representing various operations in a method of self-aligned via and plug patterning using diagonal hardmasks, in accordance with an embodiment of the present invention. In each illustration at each described operation, cross-sectional and/or plan and/or angled views are shown. These views will be referred to herein as corresponding cross-sectional views, plan views and angled views.

FIG. 1A illustrates a cross-sectional view of a starting structure 100 following deposition, but prior to patterning, of a first hardmask material layer 104 formed on an interlayer dielectric (ILD) layer 102, in accordance with an embodiment of the present invention. Referring to FIG. 1A, a patterned mask 106 has spacers 108 formed along sidewalls thereof, on or above the first hardmask material layer 104.

Figure 1B:
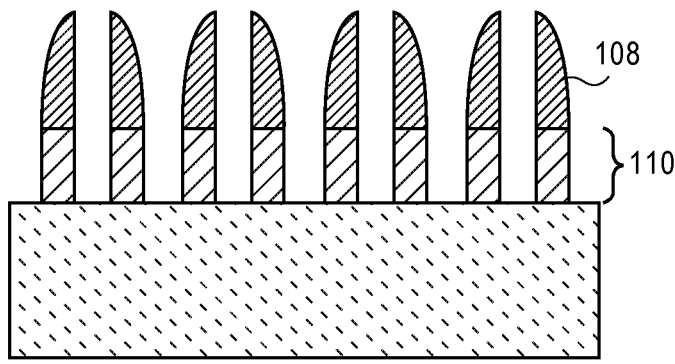
FIG. 1B illustrates a cross-sectional view of the structure of FIG. 1A following patterning of the hardmask layer by pitch doubling.

FIG. 1B illustrates a cross-sectional view of the structure of FIG. 1A following patterning of the first hardmask layer by pitch doubling, in accordance with an embodiment of the present invention. Referring to FIG. 1B, the patterned mask 106 is removed and the resulting pattern of the spacers 108 is transferred, e.g., by an etch process, to the first hardmask material layer 104 to form a first patterned hardmask 110. In one such embodiment, the first patterned hardmask 110 is formed with a grating pattern, as is depicted in FIG. 1B. In an embodiment, the grating structure of the first patterned hardmask 110 is a tight pitch grating structure. In a specific such embodiment, the tight pitch is not achievable directly through conventional lithography. For example, a pattern based on conventional lithography may first be formed (mask 106), but the pitch may be halved by the use of spacer mask patterning, as is depicted in FIGS. 1A and 1B. Even further, although not shown, the original pitch may be quartered by a second round of spacer mask patterning. Accordingly, the grating-like pattern of the first patterned hardmask 110 of FIG. 1B may have hardmask lines spaced at a constant pitch and having a constant width.

Figure 1C:
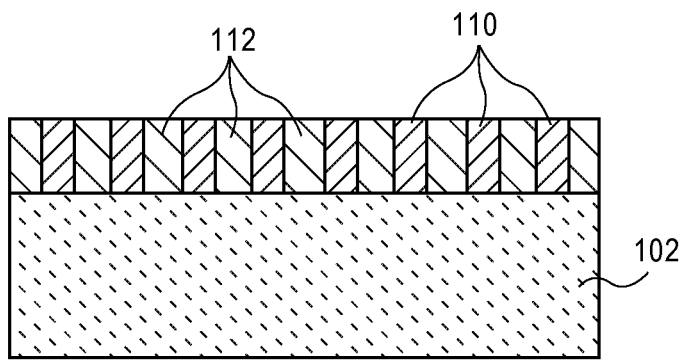
FIG. 1C illustrates a cross-sectional view of the structure of FIG. 1B following formation of a second patterned hardmask.

FIG. 1C illustrates a cross-sectional view of the structure of FIG. 1B following formation of a second patterned hardmask, in accordance with an embodiment of the present invention. Referring to FIG. 1C, a second patterned hardmask 112 is formed interleaved with the first patterned hardmask 110. In one such embodiment, the second patterned hardmask 112 is formed by deposition of a second hardmask material layer (e.g., having a composition different from the first hardmask material layer 104). The second hardmask material layer is then planarized, e.g., by chemical mechanical polishing (CMP), to provide the second patterned hardmask 112.

Figure 1D:
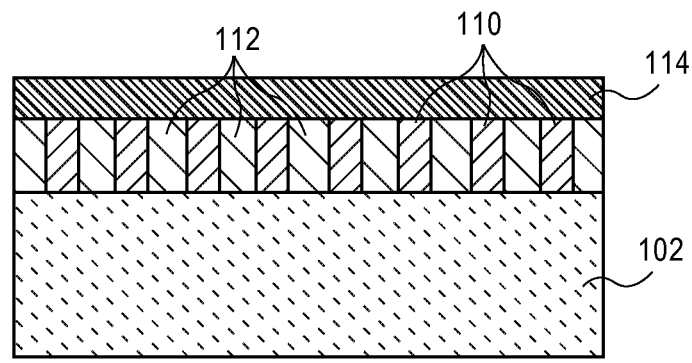
FIG. 1D illustrates a cross-sectional view of the structure of FIG. 1C following deposition of a hardmask cap layer.

FIG. 1D illustrates a cross-sectional view of the structure of FIG. 1C following deposition of a hardmask cap layer (third hardmask layer), in accordance with an embodiment of the present invention. Referring to FIG. 1D, a hardmask cap layer 114 is formed on the first patterned hardmask 110 and the first patterned hardmask 112. In one such embodiment, the material composition and etch selectivity of the hardmask cap layer 114 is different as compared to the first patterned hardmask 110 and the first patterned hardmask 112.

Figure 1E:
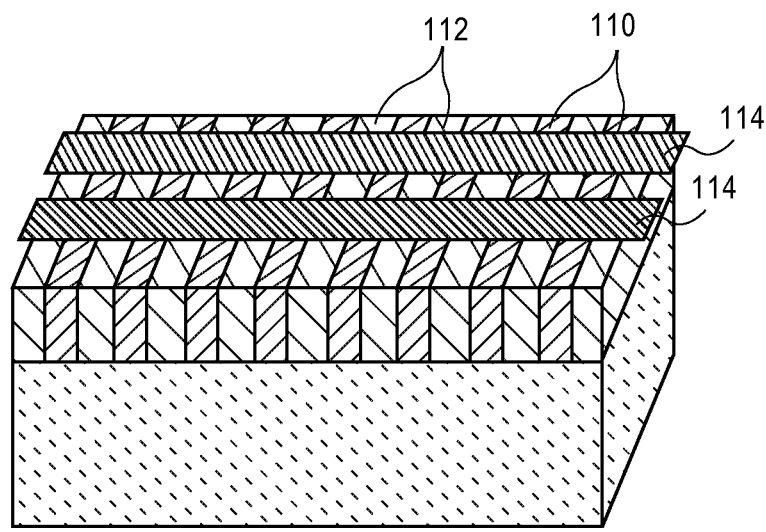
FIG. 1E illustrates an angled view of the structure of FIG. 1D following patterning of the hardmask cap layer.

FIG. 1E illustrates an angled view of the structure of FIG. 1D following patterning of the hardmask cap layer, in accordance with an embodiment of the present invention. Referring to FIG. 1E, a patterned hardmask cap layer 114 is formed on the first patterned hardmask 110 and the first patterned hardmask 112. In one such embodiment, the patterned hardmask cap layer 114 is formed with a grating pattern orthogonal to the grating pattern of the first patterned hardmask 110 and the first patterned hardmask 112, as is depicted in FIG. 1E. In an embodiment, the grating structure formed by the patterned hardmask cap layer 114 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the patterned hardmask cap layer 114 of FIG. 1E may have hardmask lines spaced at a constant pitch and having a constant width. It is to be appreciated that description herein concerning forming and patterning a hardmask layer (or hardmask cap layer, such as hardmask cap layer 114) involves, in an embodiment, mask formation above a blanket hardmask or hardmask cap layer. The mask formation may involve use of one or more layers suitable for lithographic processing. Upon patterning the one or more lithographic layers, the pattern is transferred to the hardmask or hardmask cap layer by an etch process to provide a patterned hardmask or hardmask cap layer.

Figure 1F:
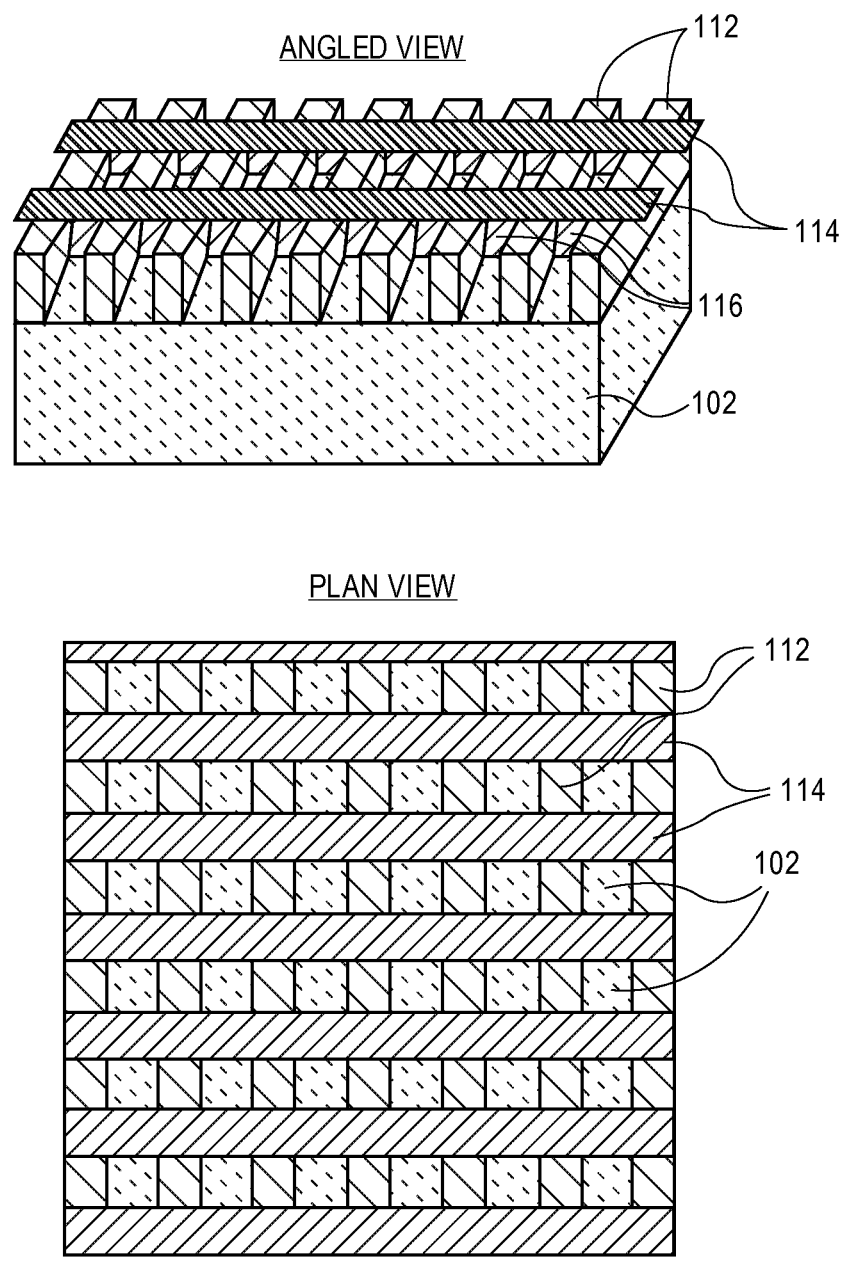
FIG. 1F illustrates an angled view and corresponding plan view of the structure of FIG. 1E following further patterning of the first patterned hardmask, in accordance with an embodiment of the present invention.

FIG. 1F illustrates an angled view and corresponding plan view of the structure of FIG. 1E following further patterning of the first patterned hardmask, in accordance with an embodiment of the present invention. Referring to FIG. 1F, using the patterned hardmask cap layer 114 as a mask, the first patterned hardmask 110 is further patterned to form first patterned hardmask 116. The second patterned hardmask 112 is not further patterned in this process. In an embodiments, the first patterned hardmask 110 is patterned to a depth sufficient to expose regions of ILD layer 102 as is depicted in FIG. 1F.

Figure 1G:
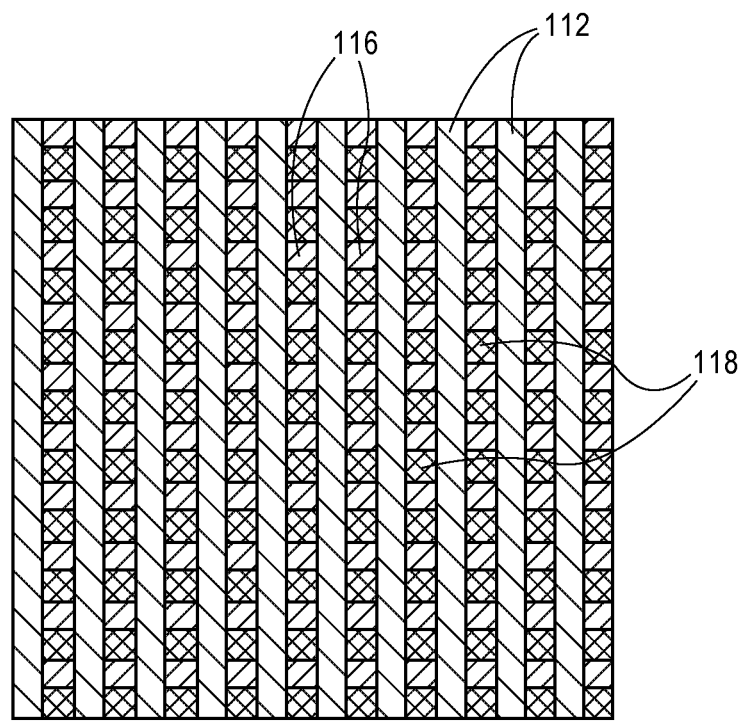
FIG. 1G illustrates a plan view of the structure of FIG. 1F following removal of the hardmask cap layer and formation of a fourth hardmask layer, in accordance with an embodiment of the present invention.

FIG. 1G illustrates a plan view of the structure of FIG. 1F following removal of the hardmask cap layer and formation of a fourth hardmask layer, in accordance with an embodiment of the present invention. Referring to FIG. 1G, the hardmask cap layer (third hardmask layer) 114 is removed, e.g., by a wet etch process, dry etch process, or CMP process. A fourth hardmask layer 118 is formed on the resulting structure by, in one embodiment, a deposition and CMP process. In one such embodiment, the fourth hardmask layer 118 is formed by deposition of a material layer different from the material of the second patterned hardmask layer 112 and the first patterned hardmask layer 116.

Figure 1H:
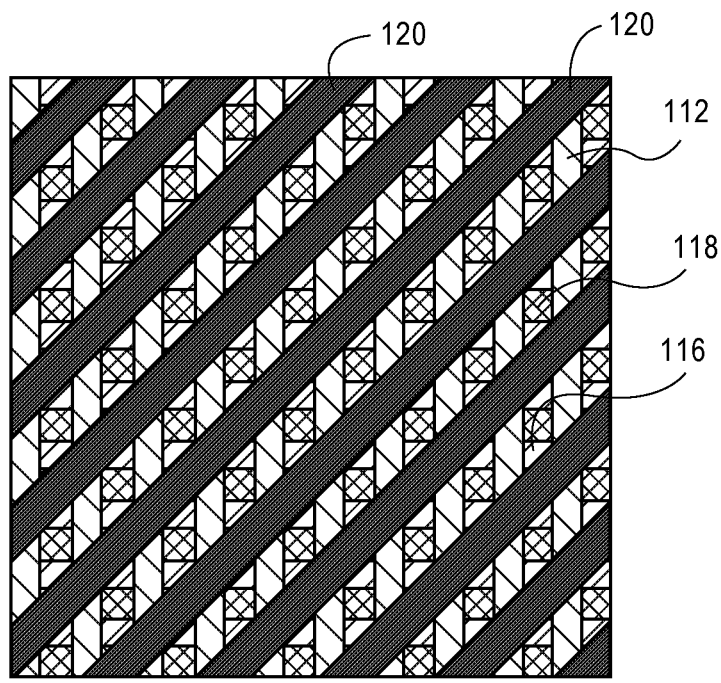
FIG. 1H illustrates a plan view of the structure of FIG. 1G following deposition and patterning of a first diagonal hardmask layer, in accordance with an embodiment of the present invention.

FIG. 1H illustrates a plan view of the structure of FIG. 1G following deposition and patterning of a first diagonal hardmask layer, in accordance with an embodiment of the present invention. Referring to FIG. 1H, a first diagonal hardmask layer 120 is formed on the fourth hardmask layer 118, the second patterned hardmask layer 112, and the first patterned hardmask layer 116 arrangement of FIG. 1G. In an embodiment, the first diagonal hardmask layer 120 has a pattern essentially or perfectly symmetrically diagonal, e.g., at 45 degrees relative to the grating structure of the second pattern hardmask layer 112, to cover alternate lines of the fourth hardmask layer 118. In an embodiment, the diagonal pattern of the first diagonal hardmask layer 120 is printed at minimum critical dimension (CD), i.e., without the use of pitch halving or pitch quartering. It is to be appreciated that the individual lines may be printed even larger than minimum CD so long as some area of adjacent rows of the fourth hardmask layer 118 remains revealed. Regardless, the grating-like pattern of the first diagonal hardmask layer 120 of FIG. 1H may have hardmask lines spaced at a constant pitch and having a constant width. It is to be appreciated that description herein concerning forming and patterning a diagonal hardmask layer (such a the first diagonal hardmask layer 120) involves, in an embodiment, mask formation above a blanket hardmask layer. The mask formation may involve use of one or more layers suitable for lithographic processing. Upon patterning the one or more lithographic layers, the pattern is transferred to the hardmask layer by an etch process to provide a diagonally patterned hardmask layer. In a particular embodiment, the first diagonal hardmask layer is a carbon-based hardmask layer.

Figure 1I:
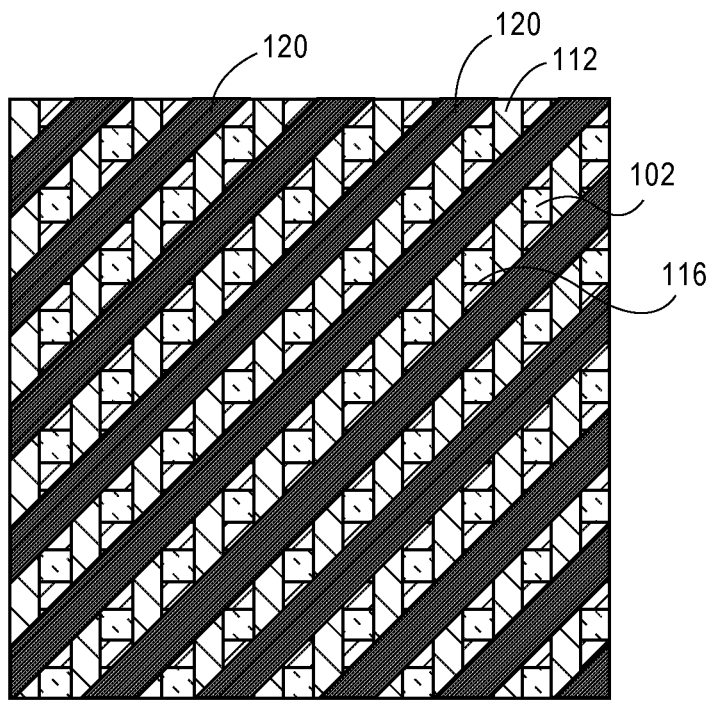
FIG. 1I illustrates a plan view of the structure of FIG. 1H following removal of revealed regions of the fourth hardmask layer, in accordance with an embodiment of the present invention.

FIG. 1I illustrates a plan view of the structure of FIG. 1H following removal of revealed regions of the fourth hardmask layer, in accordance with an embodiment of the present invention. Referring to FIG. 1I, using the first diagonal hardmask layer 120 as a mask, revealed regions of the fourth hardmask layer 118 are removed. In one such embodiment, the revealed regions of the fourth hardmask layer 118 are removed by an isotropic etch process (e.g., a wet etch process or non-anisotropic plasma etch process) such that any partial exposure leads to full removal of the partially revealed block of fourth hardmask material. In one embodiment, regions where the fourth hardmask layer 118 have been removed reveal portions of the ILD layer 102, as is depicted in FIG. 1I.

Figure 1J:
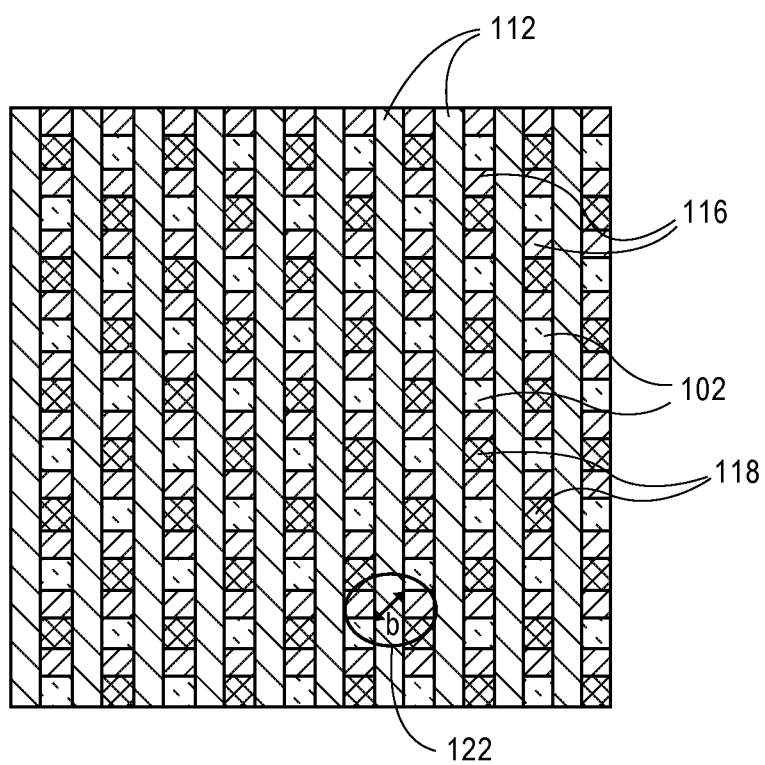
FIG. 1J illustrates a plan view of the structure of FIG. 1I following removal of the first diagonal hardmask layer, in accordance with an embodiment of the present invention.

FIG. 1J illustrates a plan view of the structure of FIG. 1I following removal of the first diagonal hardmask layer, in accordance with an embodiment of the present invention. Referring to FIG. 1J, the first diagonal hardmask layer 120 is removed to reveal the first patterned hardmask layer 116 and the second patterned hardmask layer 112. Also revealed are the portions of the fourth hardmask layer 118 that were protected from isotropic etching by the first diagonal hardmask layer 120. Accordingly, along each alternate row or down each alternate column of the resulting grid-like pattern of FIG. 1J, a region of the fourth hardmask layer 118 is alternated with a revealed region of the underlying ILD layer 102. That is, the result is a checkerboard pattern of ILD layer 102 regions and fourth hardmask layer regions 118. As such, an increase by a factor the square root of two is achieved in the nearest neighbor distance 122 (shown as distance in direction b). In a particular embodiment, the first diagonal hardmask layer 120 is a carbon-based hardmask material and is removed with a plasma ashing process.

Figure 1K:
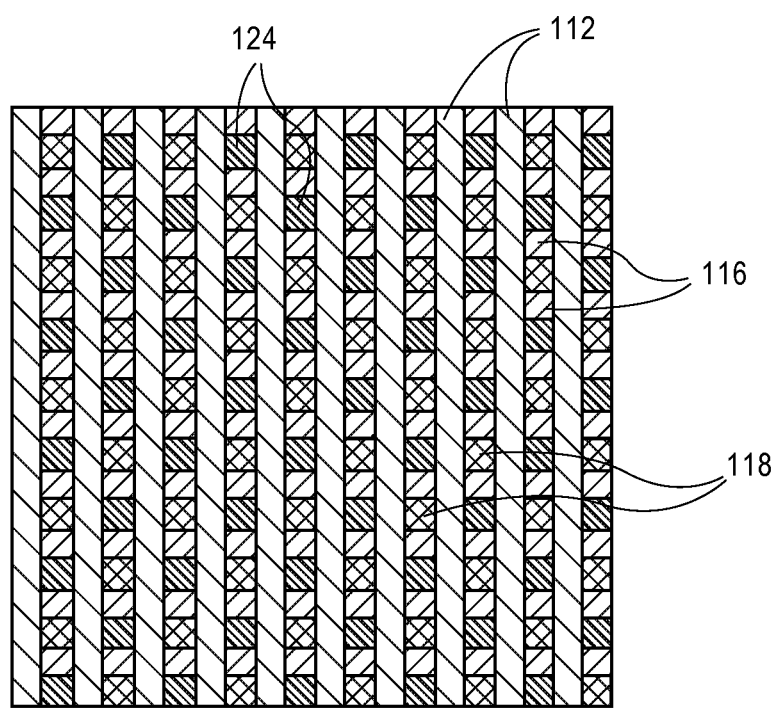
FIG. 1K illustrates a plan view of the structure of FIG. 1J following first plurality of photobucket formation, in accordance with an embodiment of the present invention.

FIG. 1K illustrates a plan view of the structure of FIG. 1J following first plurality of photobucket formation, in accordance with an embodiment of the present invention. Referring to FIG. 1K, a first plurality of photobuckets 124 is formed in openings above the ILD layer 102 such that no portion of the ILD layer 102 remains revealed. The photobuckets 124, at this stage, represent a first half of all possible via locations in a resulting metallization layer.

Figure 1L:
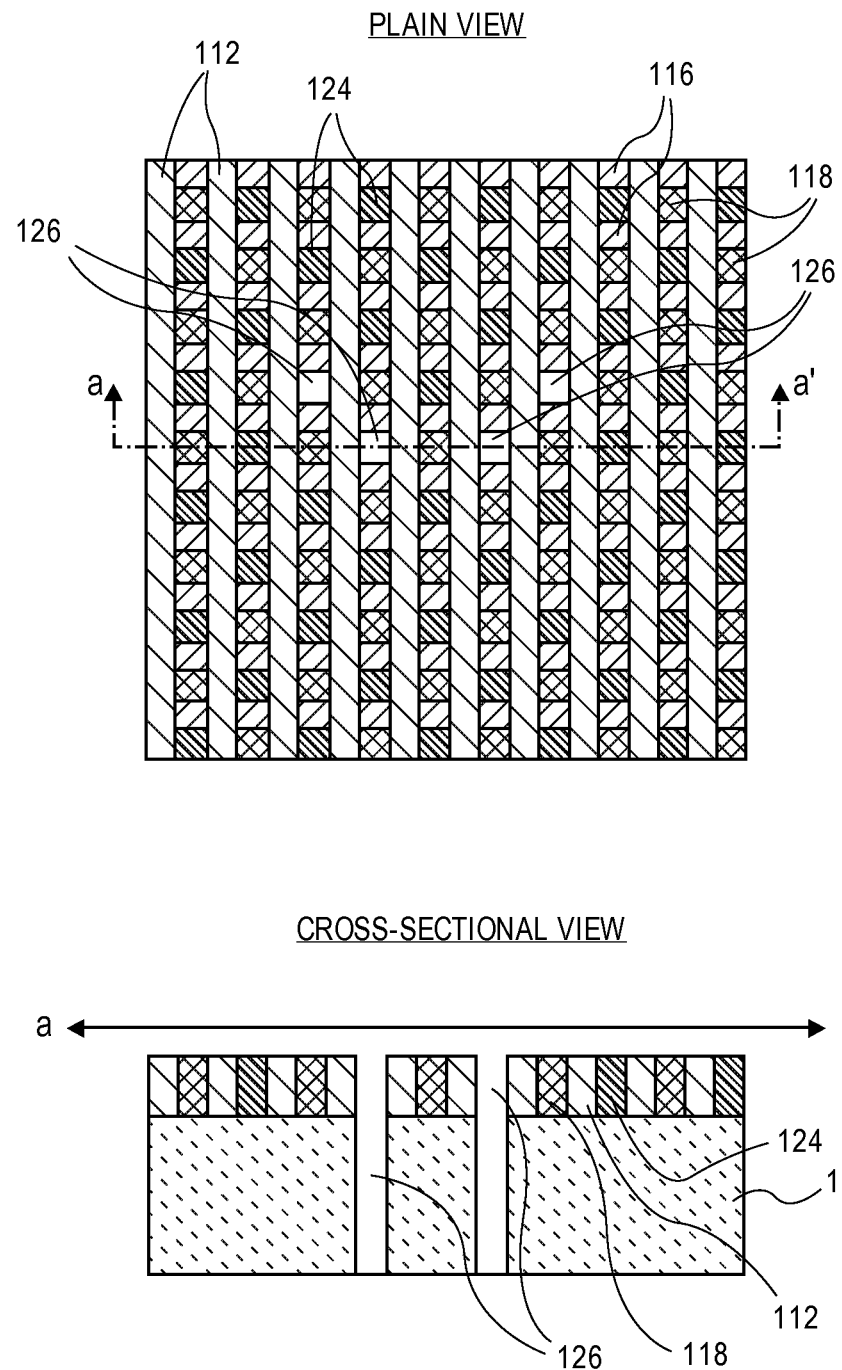
FIG. 1L illustrates a plan view and corresponding cross-sectional view (taken along the a-a' axis) of the structure of FIG. 1K following photobucket exposure and development to form selected via locations, and subsequent via opening etch into the underlying ILD, in accordance with an embodiment of the present invention.

FIG. 1L illustrates a plan view and corresponding cross-sectional view (taken along the a-a' axis) of the structure of FIG. 1K following photobucket exposure and development to form selected via locations, and subsequent via opening etch into the underlying ILD, in accordance with an embodiment of the present invention. Referring to FIG. 1L select photobuckets 124 are exposed and removed to provide selected via locations 126. The via locations 126 are subjected to a selective etch process, such as a selective plasma etch process, to extend via openings into the underlying ILD layer 102, forming patterned ILD layer 102'. The etching is selective to remaining, unexposed, photobuckets 124, selective to the first patterned hardmask layer 116, selective to the second patterned hardmask layer 112, and selective to the fourth hardmask layer 118.

Figure 1M:
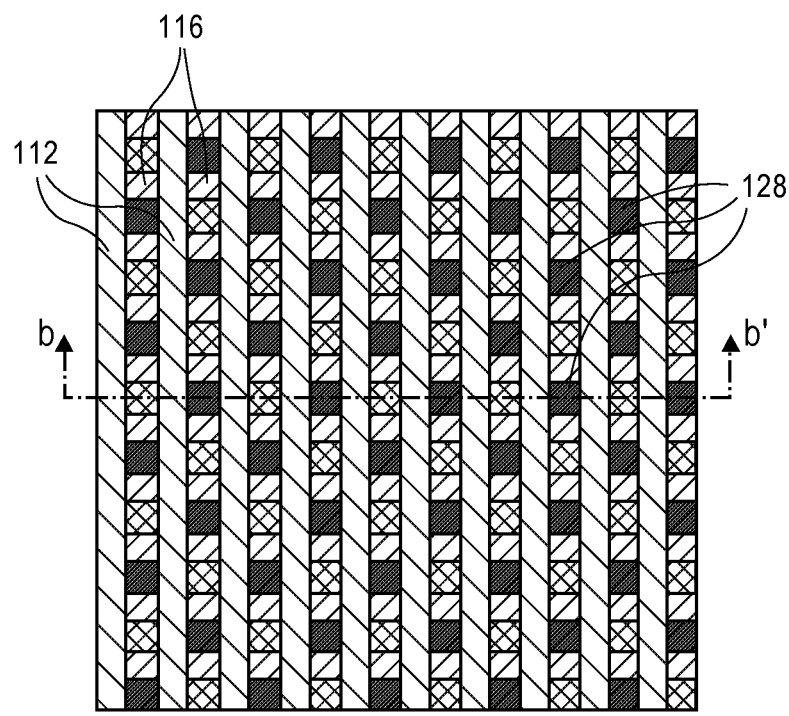
FIG. 1M illustrates a plan view and corresponding cross-sectional view (taken along the b-b' axis) of the structure of FIG. 1L following removal of the remaining photobuckets and subsequent formation of a fifth hardmask material, in accordance with an embodiment of the present invention.
Figure 1M:
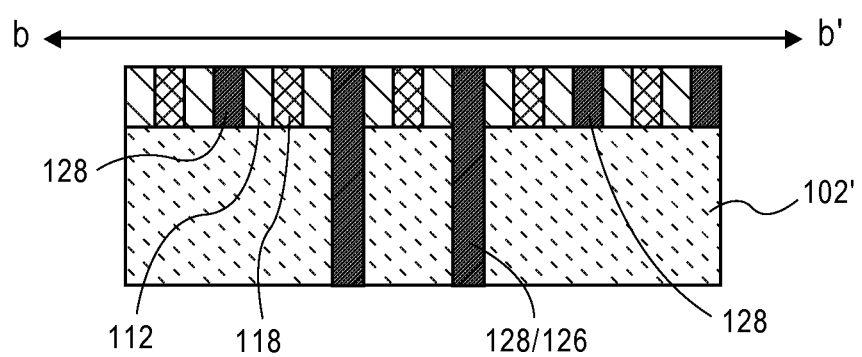

FIG. 1M illustrates a plan view and corresponding cross-sectional view (taken along the b-b' axis) of the structure of FIG. 1L following removal of the remaining photobuckets and subsequent formation of a fifth hardmask material, in accordance with an embodiment of the present invention. Referring to FIG. 1M, the remaining of the first plurality of photobuckets 124 are removed, e.g., by a selective etch or ash process. All openings revealed (e.g., openings formed upon removal of photobuckets 124 along with the via locations 126) are then filled with a hardmask material 128, such as a carbon-based hardmask material.

Figure 1N:
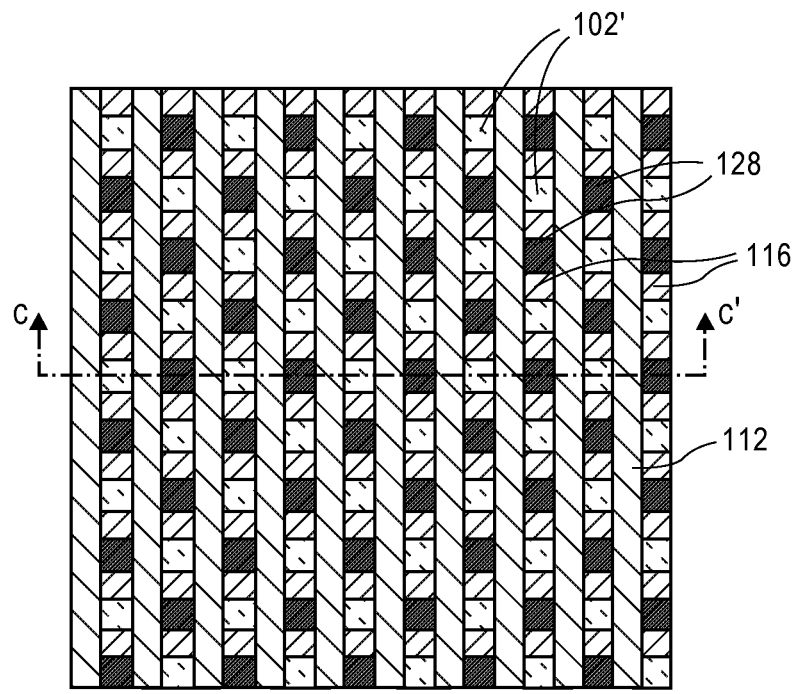
FIG. 1N illustrates a plan view and corresponding cross-sectional view (taken along the c-c' axis) of the structure of FIG. 1M following removal of the remaining regions of the fourth hardmask layer, in accordance with an embodiment of the present invention.
Figure 1N:
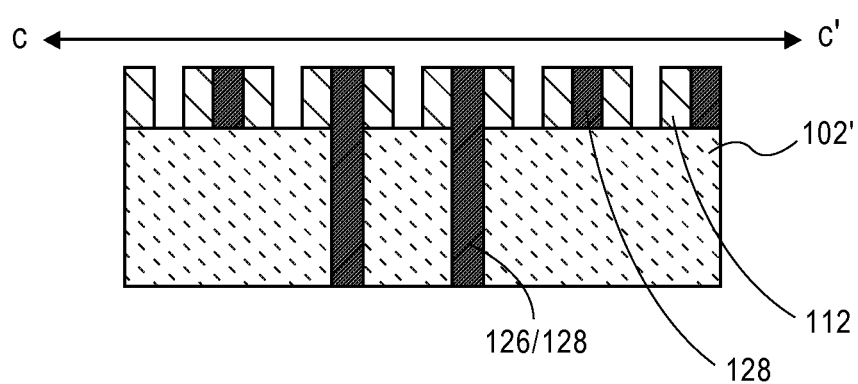

FIG. 1N illustrates a plan view and corresponding cross-sectional view (taken along the c-c' axis) of the structure of FIG. 1M following removal of the remaining regions of the fourth hardmask layer, in accordance with an embodiment of the present invention. Referring to FIG. 1N, all remaining regions of the fourth hardmask layer 118 are removed, e.g., by a selective etch or ash process. In one embodiment, regions where the remaining fourth hardmask layer 118 have been removed reveal portions of the patterned ILD layer 102', as is depicted in FIG. 1N.

Figure 1O:
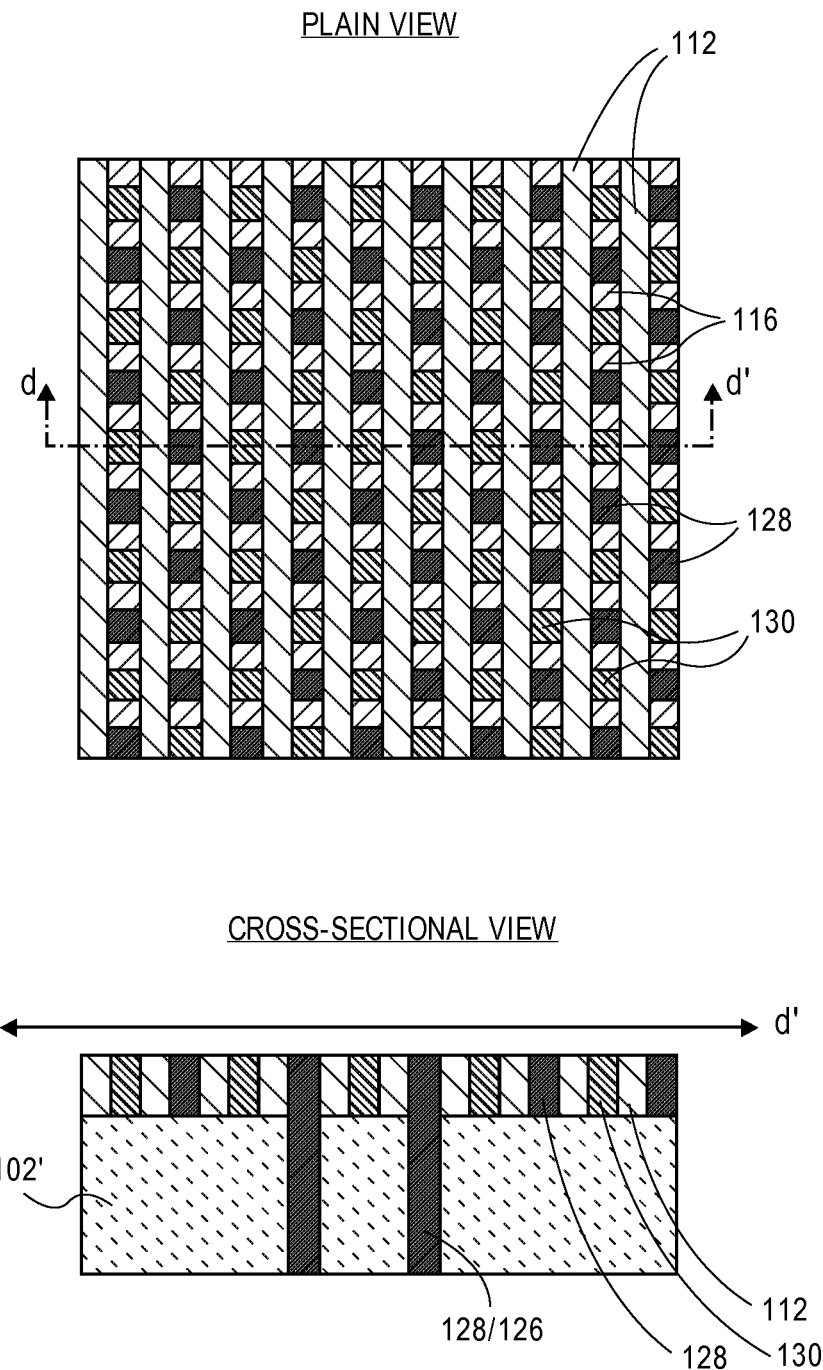
FIG. 1O illustrates a plan view and corresponding cross-sectional view (taken along the d-d' axis) of the structure of FIG. 1N following second plurality of photobucket formation, in accordance with an embodiment of the present invention.

FIG. 1O illustrates a plan view and corresponding cross-sectional view (taken along the d-d' axis) of the structure of FIG. 1N following second plurality of photobucket formation, in accordance with an embodiment of the present invention. Referring to FIG. 1O, a second plurality of photobuckets 130 is formed in openings above the patterned ILD layer 102' such that no portion of the patterned ILD layer 102' remains revealed. The photobuckets 130, at this stage, represent a second half of all possible via locations in a resulting metallization layer.

Figure 1P:
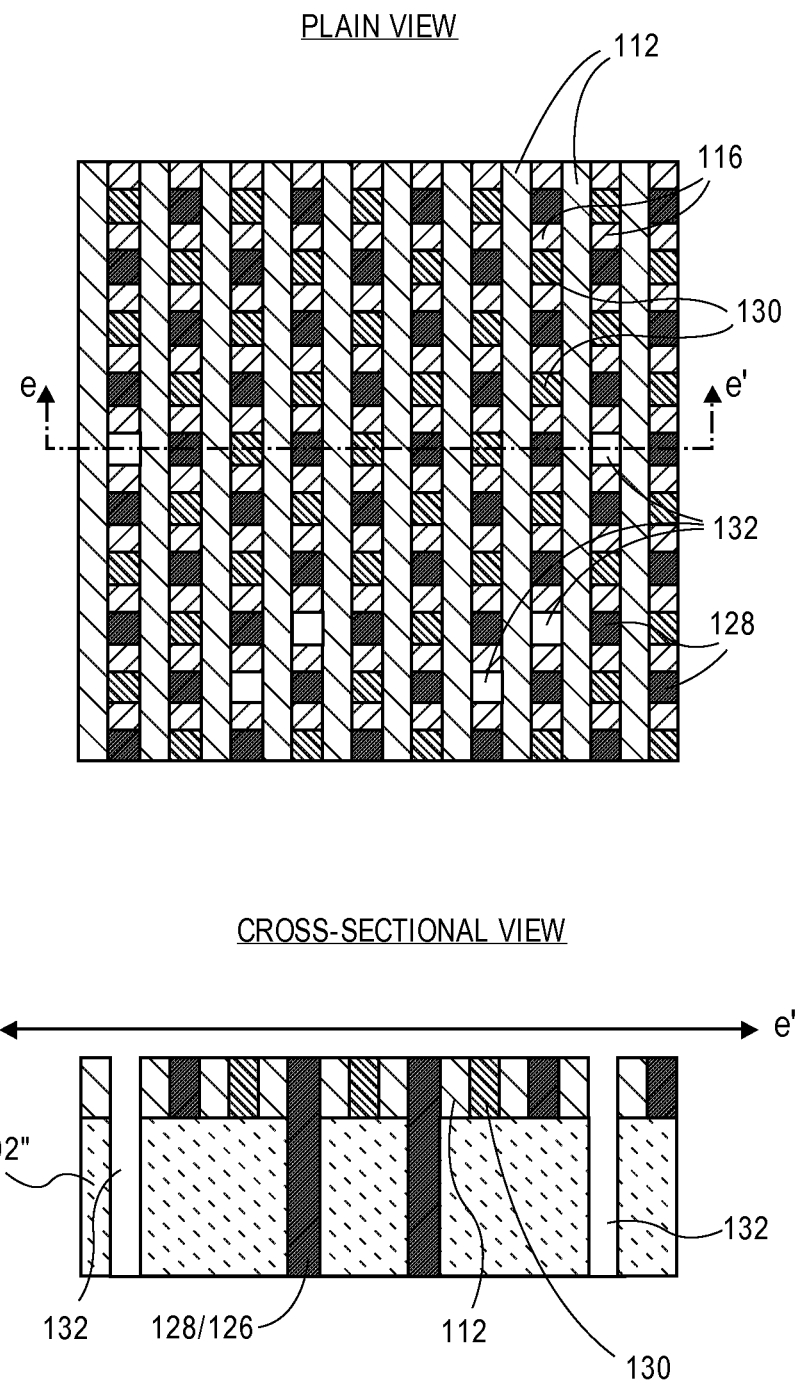
FIG. 1P illustrates a plan view and corresponding cross-sectional view (taken along the e-e' axis) of the structure of FIG. 1O following photobucket exposure and development to form selected via locations, and subsequent via opening etch into the underlying ILD, in accordance with an embodiment of the present invention.

FIG. 1P illustrates a plan view and corresponding cross-sectional view (taken along the e-e' axis) of the structure of FIG. 1O following photobucket exposure and development to form selected via locations, and subsequent via opening etch into the underlying ILD, in accordance with an embodiment of the present invention. Referring to FIG. 1P, select photobuckets 130 are exposed and removed to provide selected via locations 132. The via locations 132 are subjected to a selective etch process, such as a selective plasma etch process, to extend via openings into the underlying patterned ILD layer 102', forming further patterned ILD layer 102". The etching is selective to remaining, unexposed, photobuckets 130, selective to the first patterned hardmask layer 116, selective to the second patterned hardmask layer 112, and selective to the hardmask material 128.

Figure 1Q:
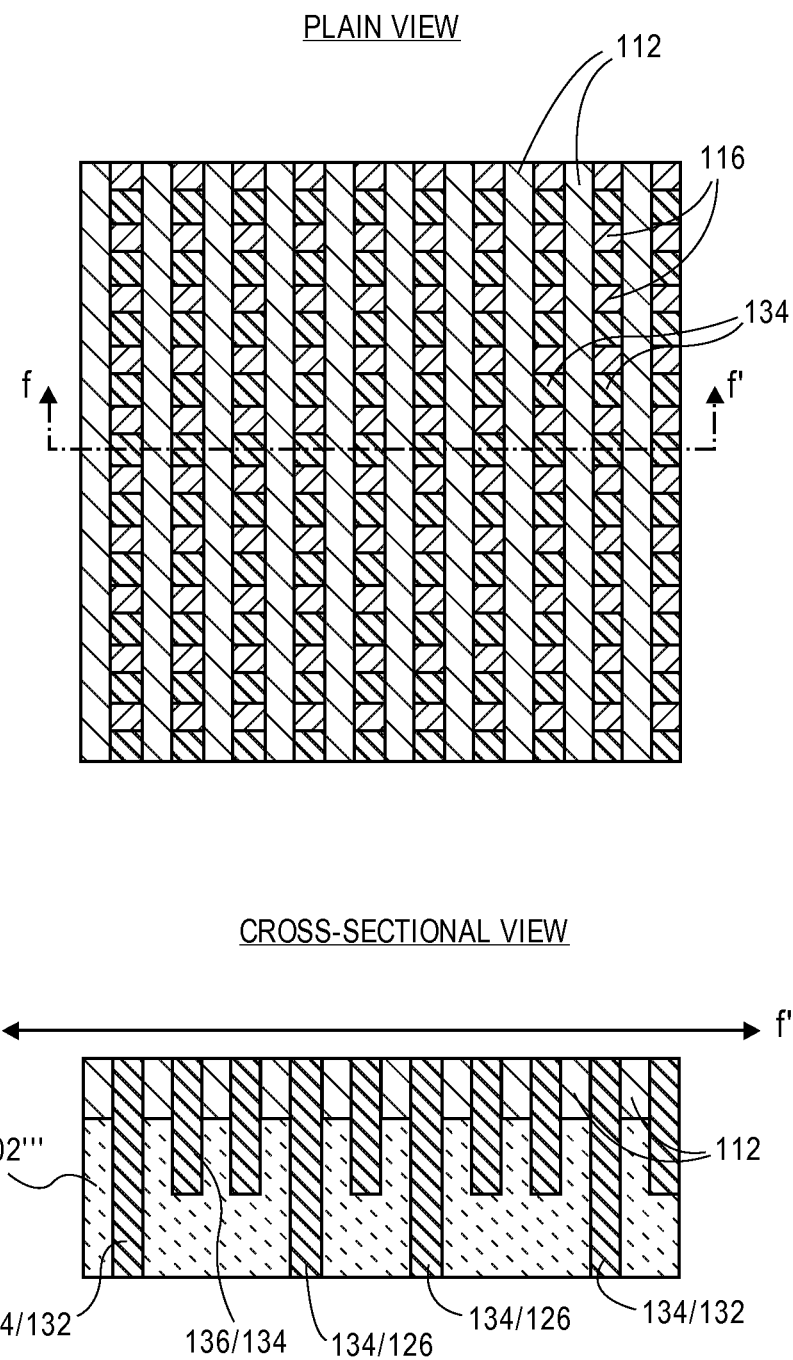
FIG. 1Q illustrates a plan view and corresponding cross-sectional view (taken along the f-f' axis) of the structure of FIG. 1P following removal of the fifth hardmask material, trench etching, and subsequent sacrificial layer formation, in accordance with an embodiment of the present invention.

FIG. 1Q illustrates a plan view and corresponding cross-sectional view (taken along the f-f axis) of the structure of FIG. 1P following removal of the fifth hardmask material, trench etching, and subsequent sacrificial layer formation, in accordance with an embodiment of the present invention. Referring to FIG. 1Q, hardmask material layer 128 is removed, revealing all of the original first and second halves of the potential via locations. The patterned ILD layer 102" is then patterned to form ILD layer 102' which includes the via openings 132 and 126, along with trenches 136 where via openings were not formed. The trenches 136 will ultimately be used for metal line fabrication, as is described below. Upon completion of the trench etch, all openings (including via openings 126 and 132 and trenches 136) are filled with a sacrificial material 134. In one embodiment, the hardmask material layer 128 is a carbon-based hardmask material and is removed with a plasma ashing process. In one embodiment, the sacrificial material 134 is flowable organic or inorganic material such as a sacrificial light absorbing material (SLAM), as is known in the art. The sacrificial material 134 is either formed to, or planarized to, to level of the first patterned hardmask 116 and the second patterned hardmask 112, as is depicted in FIG. 1Q.

Figure 1R:
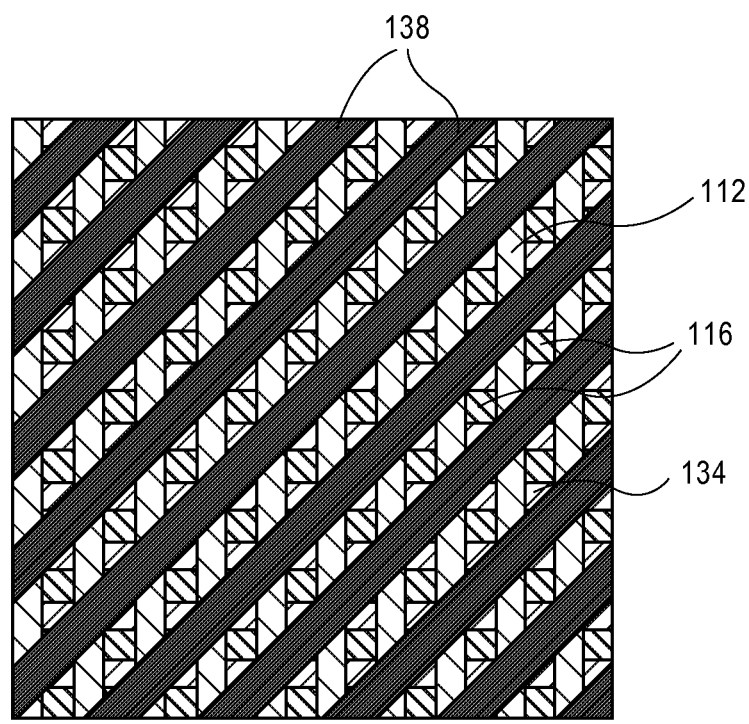
FIG. 1R illustrates a plan view of the structure of FIG. 1Q following deposition and patterning of a second diagonal hardmask layer, in accordance with an embodiment of the present invention.

FIG. 1R illustrates a plan view of the structure of FIG. 1Q following deposition and patterning of a second diagonal hardmask layer, in accordance with an embodiment of the present invention. Referring to FIG. 1R, a second diagonal hardmask layer 138 is formed on the sacrificial material 134, the second patterned hardmask layer 112, and the first patterned hardmask layer 116 arrangement of FIG. 1Q. In an embodiment, the second diagonal hardmask layer 138 has a pattern essentially or perfectly symmetrically diagonal, e.g., at 45 degrees relative to the grating structure of the second pattern hardmask layer 112, to cover alternate lines of the first patterned hardmask layer 116. In an embodiment, the diagonal pattern of the second diagonal hardmask layer 138 is printed at minimum critical dimension (CD), i.e., without the use of pitch halving or pitch quartering. It is to be appreciated that the individual lines may be printed even larger than minimum CD so long as some area of adjacent rows of the first patterned hardmask layer 116 remains revealed. Regardless, the grating-like pattern of the second diagonal hardmask layer 138 of FIG. 1R may have hardmask lines spaced at a constant pitch and having a constant width. It is to be appreciated that description herein concerning forming and patterning a diagonal hardmask layer (such a the second diagonal hardmask layer 138) involves, in an embodiment, mask formation above a blanket hardmask layer. The mask formation may involve use of one or more layers suitable for lithographic processing. Upon patterning the one or more lithographic layers, the pattern is transferred to the hardmask layer by an etch process to provide a diagonally patterned hardmask layer. In a particular embodiment, the second diagonal hardmask layer 138 is a carbon-based hardmask layer.

Figure 1S:
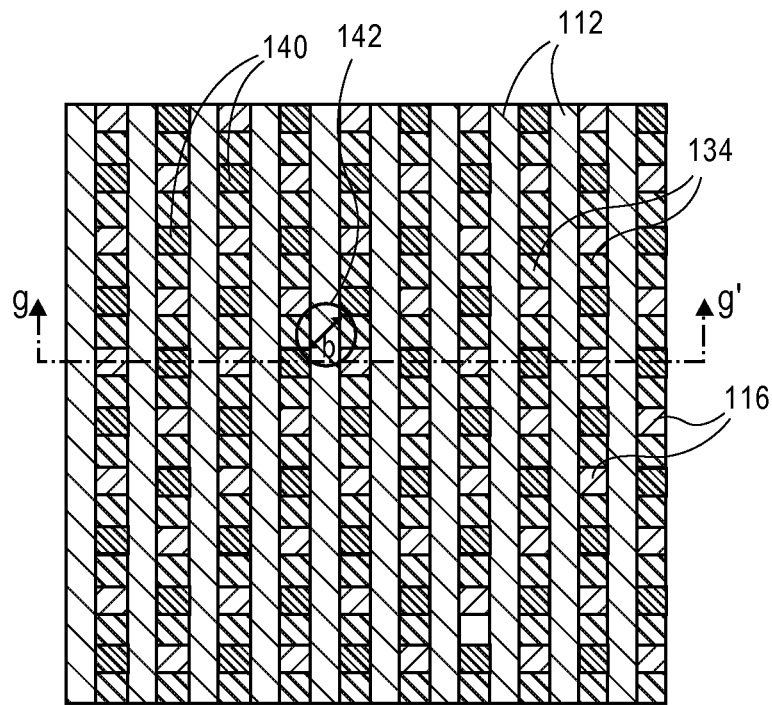
FIG. 1S illustrates a plan view and corresponding cross-sectional view (taken along the g-g' axis) of the structure of FIG. 1R following removal of revealed regions of the first patterned hardmask layer, removal of the second diagonal hardmask layer, and following third plurality of photobucket formation, in accordance with an embodiment of the present invention.
Figure 1S:
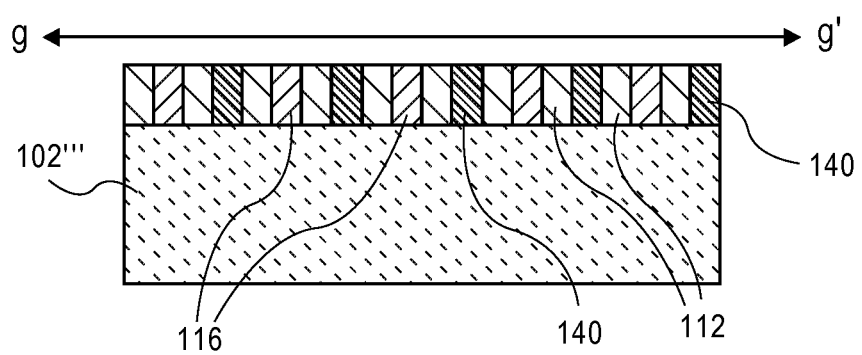

FIG. 1S illustrates a plan view and corresponding cross-sectional view (taken along the g-g' axis) of the structure of FIG. 1R following removal of revealed regions of the first patterned hardmask layer, removal of the second diagonal hardmask layer, and following third plurality of photobucket formation, in accordance with an embodiment of the present invention. Referring to FIG. 1S, using the second diagonal hardmask layer 138 as a mask, revealed regions of the first patterned hardmask layer 116 are removed. In one such embodiment, the revealed regions of the first patterned hardmask layer 116 are removed by an isotropic etch process (e.g., a wet etch process or non-anisotropic plasma etch process) such that any partial revealing leads to full removal of the partially revealed block of the first patterned hardmask layer 116. Referring again to FIG. 1S, the second diagonal hardmask layer 138 is removed to reveal the sacrificial material 134 and the second patterned hardmask layer 112. Also revealed are the portions of the first patterned hardmask layer 116 that were protected from isotropic etching by the second diagonal hardmask layer 138. In a particular embodiment, the second diagonal hardmask layer 138 is a carbon-based hardmask material and is removed with a plasma ashing process. Referring again to FIG. 1S, a third plurality of photobuckets 140 is formed in the resulting openings above the patterned ILD layer 102''' such that no portion of the patterned ILD layer 102''' remains revealed. The photobuckets 140, at this stage, represent a first half of all possible plug locations in a resulting metallization layer. Accordingly, along each alternate row or down each alternate column of the resulting grid-like pattern of FIG. 1S, a region of the first patterned hardmask layer 116 is alternated with a photobucket 140. That is, the result is a checkerboard pattern of photobucket 140 regions and first patterned hardmask layer 116 regions. As such, an increase by a factor the square root of two is achieved in the nearest neighbor distance 142 (shown as distance in direction b).

Figure 1T:
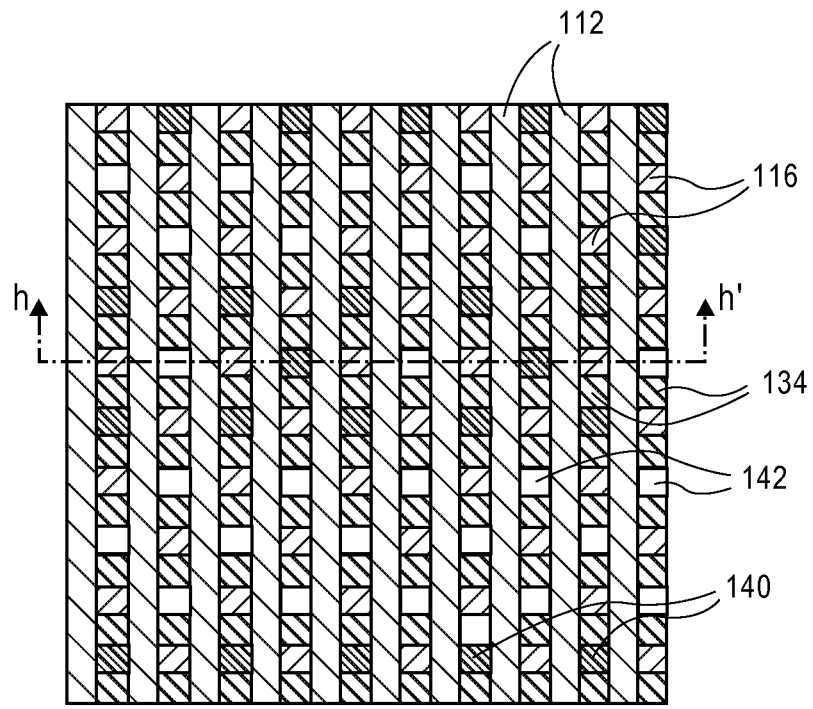
FIG. 1T illustrates a plan view and corresponding cross-sectional view (taken along the h-h' axis) of the structure of FIG. 1S following plug location selection and trench etching.
Figure 1T:
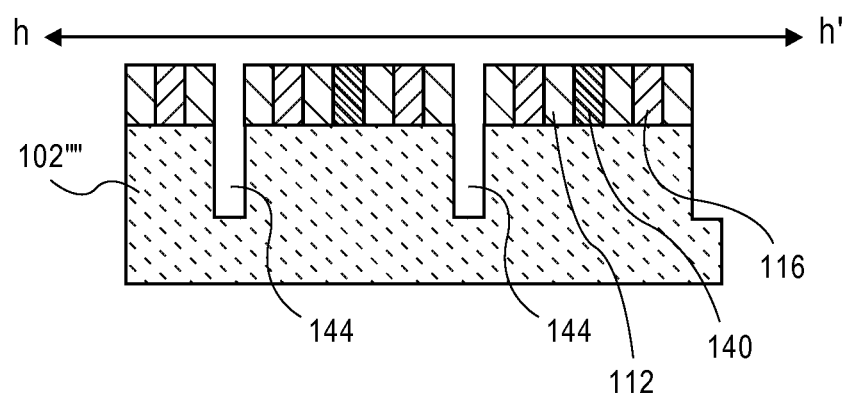

FIG. 1T illustrates a plan view and corresponding cross-sectional view (taken along the h-h' axis) of the structure of FIG. 1S following plug location selection and trench etching, in accordance with an embodiment of the present invention. Referring to FIG. 1T, the photobuckets 140 from FIG. 1S in are removed from locations 142 where plugs will not be formed. In locations where plugs are selected to be formed, the photobuckets 140 are retained. In one embodiment, in order to form locations 142 where plugs will not be formed, lithography is used to expose the corresponding photobuckets 140. The exposed photobuckets may then be removed by a developer. The patterned ILD layer 102''' is then patterned to form ILD layer 102'''' which includes trenches 144 formed at locations 142. The trenches 144 will ultimately be used for metal line fabrication, as is described below.

Figure 1U:
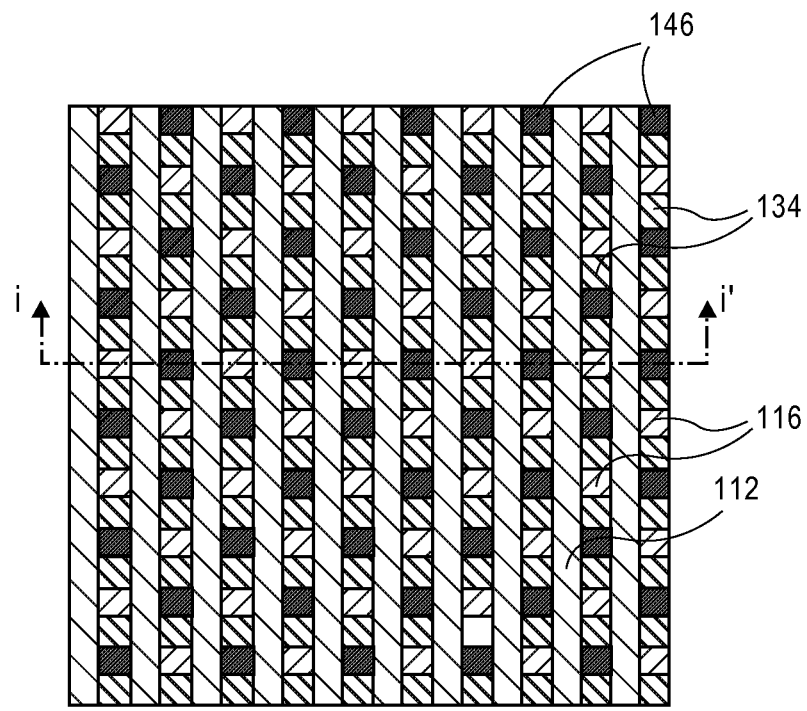
FIG. 1U illustrates a plan view and corresponding cross-sectional view (taken along the i-i' axis) of the structure of FIG. 1T following removal of remaining third photobuckets and subsequent hardmask formation.
Figure 1U:
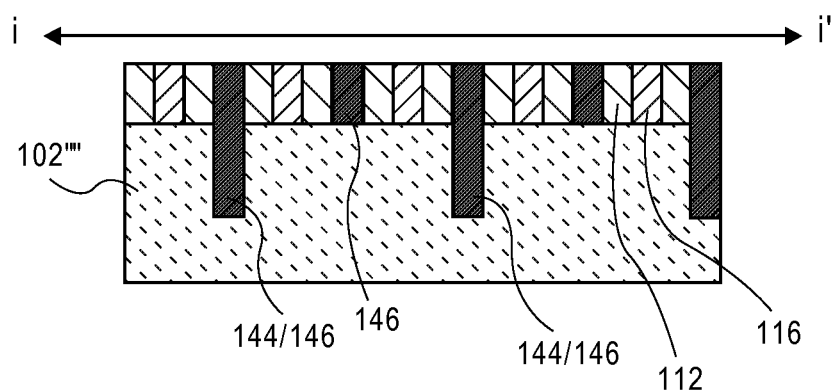

FIG. 1U illustrates a plan view and corresponding cross-sectional view (taken along the i-i' axis) of the structure of FIG. 1T following removal of remaining third photobuckets and subsequent hardmask formation, in accordance with an embodiment of the present invention. Referring to FIG. 1U, all remaining photobuckets 140 are removed, e.g., by an ashing process. Upon removal of all remaining photobuckets 140, all openings (including trenches 144) are filled with a hardmask material layer 146. In one embodiment, the hardmask material layer 146 is a carbon-based hardmask material.

Figure 1V:
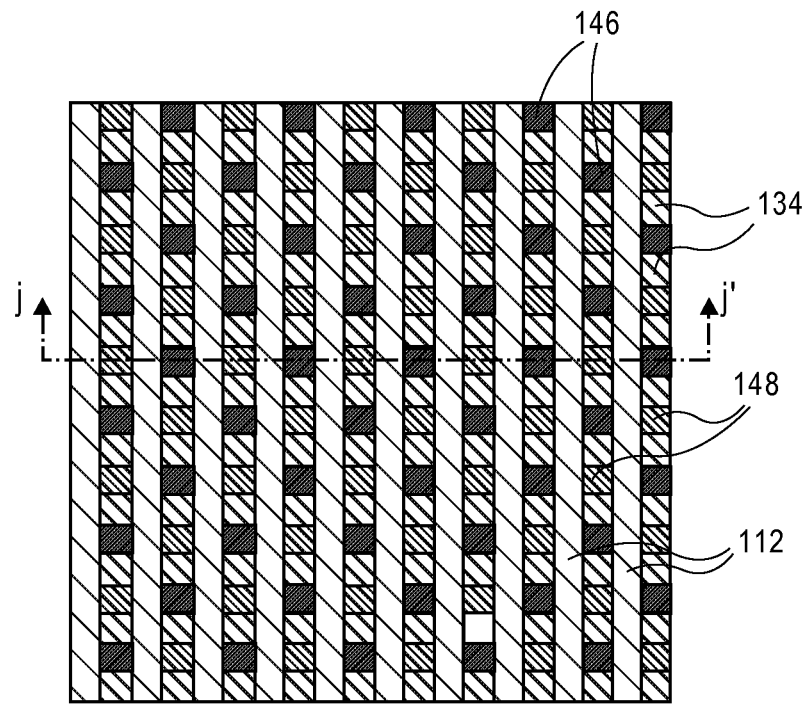
FIG. 1V illustrates a plan view and corresponding cross-sectional view (taken along the j-j' axis) of the structure of FIG. 1V following first patterned hardmask removal and fourth plurality of photobucket formation.
Figure 1V:
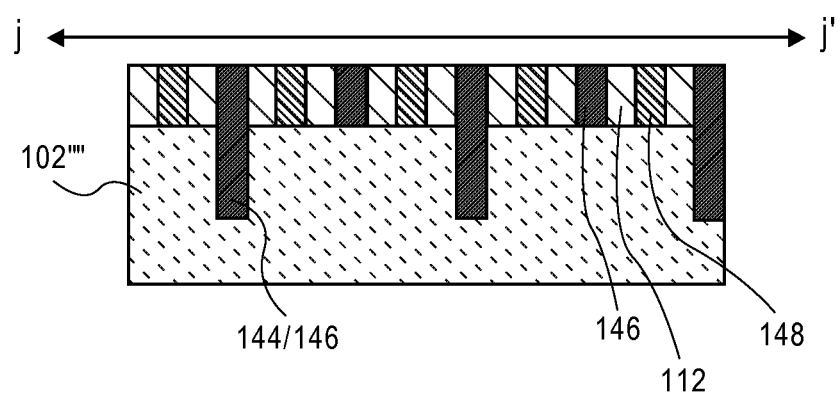

FIG. 1V illustrates a plan view and corresponding cross-sectional view (taken along the j-j' axis) of the structure of FIG. 1V following first patterned hardmask removal and fourth plurality of photobucket formation, in accordance with an embodiment of the present invention. Referring to FIG. 1V, the first patterned hardmask layer 116 is removed (e.g., by a selective dry or wet etch process), and a fourth plurality of photobuckets 148 is formed in the resulting openings above the patterned ILD layer 102'''' such that no portion of the patterned ILD layer 102'''' remains revealed. The photobuckets 148, at this stage, represent a second half of all possible plug locations in a resulting metallization layer.

Figure 1W:
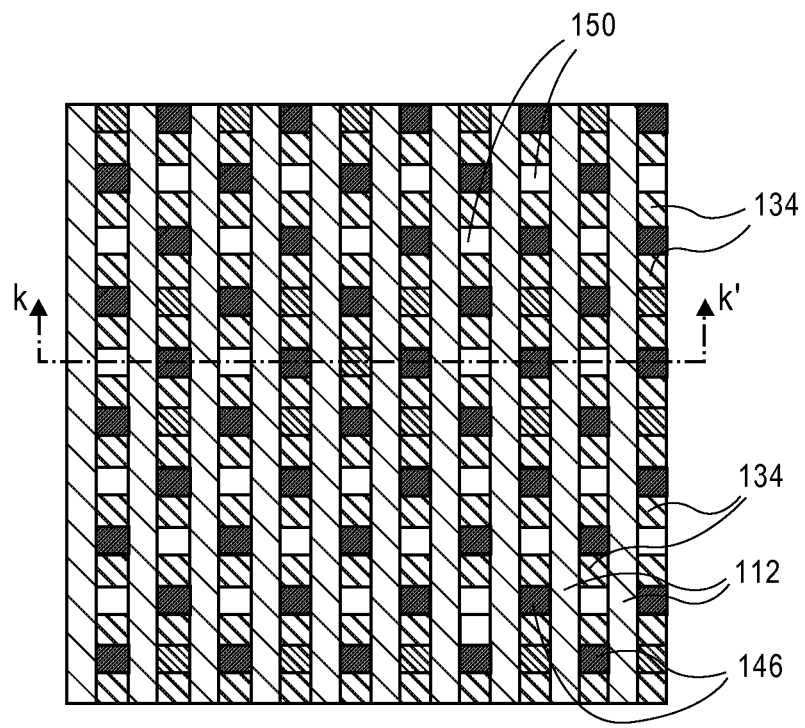
FIG. 1W illustrates a plan view and corresponding cross-sectional view (taken along the k-k' axis) of the structure of FIG. 1V following plug location selection and trench etching.
Figure 1W:
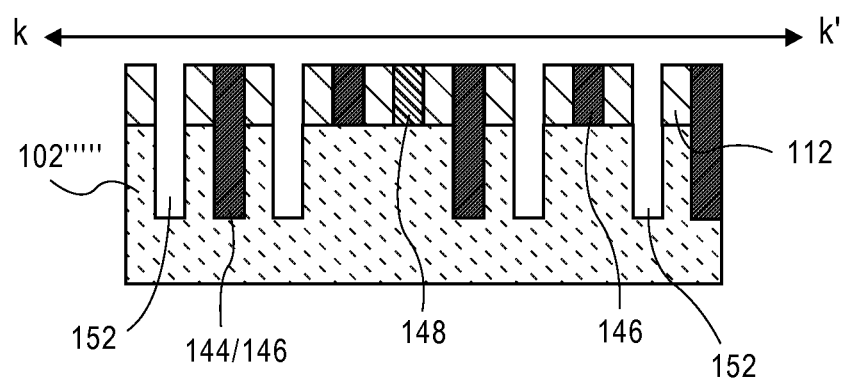
Figure 1X:
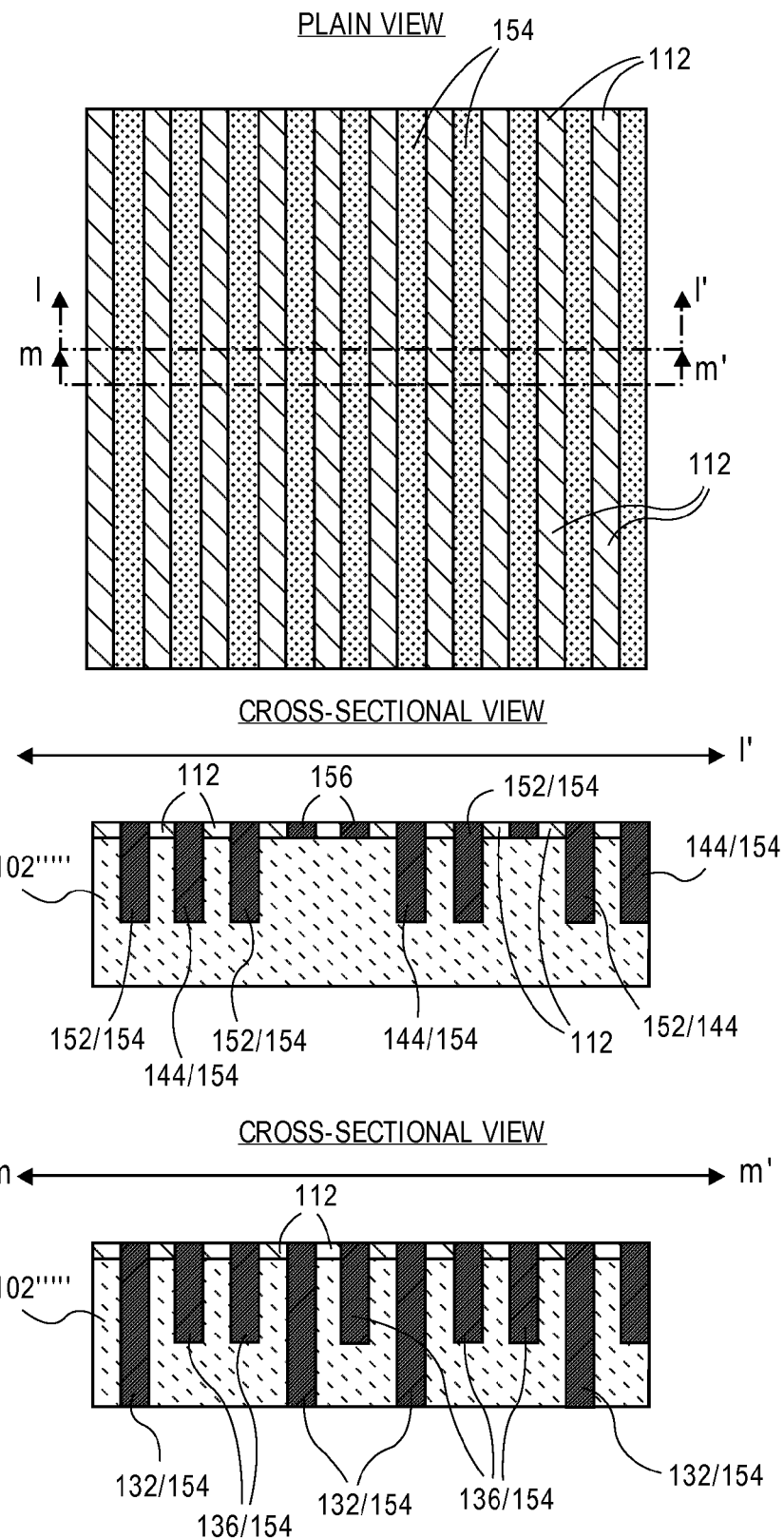

FIG. 1W illustrates a plan view and corresponding cross-sectional view (taken along the k-k' axis) of the structure of FIG. 1V following plug location selection and trench etching, in accordance with an embodiment of the present invention. Referring to FIG. 1W, the photobuckets 148 from FIG. 1V in are removed from locations 150 where plugs will not be formed. In locations where plugs are selected to be formed, the photobuckets 148 are retained. In one embodiment, in order to form locations 150 where plugs will not be formed, lithography is used to expose the corresponding photobuckets 148. The exposed photobuckets may then be removed by a developer. The patterned ILD layer 102'''' is then patterned to form ILD layer 102''''' which includes trenches 152 formed at locations 150. The trenches 152 will ultimately be used for metal line fabrication, as is described below.

FIG. 1X illustrates a plan view and corresponding first cross-sectional view (taken along the 1-l' axis) and second cross-sectional view (taken along the m-m' axis) of the structure of FIG. 1W following removal of remaining fourth photobuckets, hardmask material layer and sacrificial material, and subsequent metal fill, in accordance with an embodiment of the present invention. Referring to FIG. 1X, remaining fourth photobuckets 148, hardmask material layer 146 and sacrificial material 134 are removed. In one such embodiment, the hardmask material layer 146 is a carbon-based hardmask material, and both the hardmask material layer 146 and the remaining fourth photobuckets 148 are removed with a plasma ashing process. In one embodiment, the sacrificial material 134 is removed in a different etch process. Referring to the plan view of FIG. 1X, metallization 154 is formed interleaved and co-planar with the second patterned hardmask layer 112. Referring to the first cross-sectional view taken along the l-l' axis of the plan view of FIG. 1X, the metallization 154 fills trenches 152 and 154 (i.e., as corresponding to the cross-sectional view taken along the k-k' axis of FIG. 1W) formed in patterned interlayer dielectric layer 102''''. Referring to the second cross-sectional view taken along the m-m' axis of the plan view of FIG. 1X, the metallization 154 also fills trenches 136 and via openings 132 and 126 (i.e., as corresponding to the cross-sectional view taken along the f-f' axis of FIG. 1Q) formed in patterned interlayer dielectric layer 102''''. Thus, the metallization 154 is used to form a plurality of conductive lines and conductive vias in an interlayer dielectric layer for a metallization structure, such as a BEOL metallization structure.

In an embodiment, the metallization 154 is formed by a metal fill and polish back process. In one such embodiment, the second patterned hardmask layer 112 is reduced in thickness during the polish back process. In a particular such embodiment, although reduced in thickness, a portion of the second patterned hardmask 112 is retained, as is depicted in FIG. 1X. Accordingly, metal features 156 that are neither conductive lines nor conductive vias formed in the patterned interlayer dielectric layer 102'''' remain interleaved with the second patterned hardmask layer and on or above (but not in) the patterned interlayer dielectric layer 102'''', as is also depicted in FIG. 1X. In an alternative particular embodiment (not shown), the second patterned hardmask 112 is entirely removed during the polish back. Accordingly, metal features 156 that are neither conductive lines nor conductive vias are not retained in the final structure. In either case, the described structures for FIG. 1X may subsequently be used as a foundation for forming subsequent metal line/via and ILD layers. Alternatively, the structure of FIG. 1X may represent the final metal interconnect layer in an integrated circuit.

It is to be appreciated that the above process operations may be practiced in alternative sequences, not every operation need be performed and/or additional process operations may be performed. Referring again to FIG. 1X, metallization layer fabrication by using a diagonal hardmask may be complete at this stage. A next layer fabricated in a like manner likely requires initiation of the entire process once again. Alternatively, other approaches may be used at this stage to provide additional interconnect layers, such as conventional dual or single damascene approaches.

In an embodiment, the term "photobucket" as used herein involves use of an ultrafast photoresist or ebeam resist or other photosensitive material as formed in etched openings. In one such embodiment, a thermal reflow of a polymer into the openings is used following a spin coat application. In one embodiment, the fast photoresist is fabricated by removing a quencher from an existing photoresist material. In another embodiment, the photobuckets are formed by an etch-back process and/or a lithography/shrink/etch process. It is to be understood that the photobuckets need not be filled with actual photoresist, so long as the material acts as a photosensitive switch. In one embodiment, lithography is used to expose the corresponding photobuckets that are selected for removal. However, the lithographic constraints may be relaxed and misalignment tolerance may be high since the photobuckets are surrounded by non-photolyzable materials. Furthermore, in an embodiment, instead of exposing at, e.g. 30 mJ/cm2, such photobuckets might be exposed at, e.g., 3 mJ/cm$^2$. Normally this would result in very poor critical dimension (CD) control and roughness. But in this case, the CD and roughness control will be defined by the photobuckets, which can be very well controlled and defined. Thus, the photobucket approach may be used to circumvent imaging/dose tradeoff which limits the throughput of next generation lithographic processes. In one embodiment, the photobuckets are subject to exposure of extreme ultraviolet (EUV) light in order to expose the photobuckets, where in a particular embodiment, EUV exposure is in the range of 5-15 nanometers.

In an embodiment, the term "grating structure" for metal lines, ILD lines or hardmask lines is used to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described above may have metal lines, ILD lines or hardmask lines spaced at a constant pitch and having a constant width. The pattern may be fabricated by a pitch halving or pitch quartering approach.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material (e.g., metal lines and/or vias) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, plug and/or cap and/or hardmask materials are composed of dielectric materials different from the interlayer dielectric material. In one embodiment, these materials are sacrificial, while interlayer dielectric materials are preserved at least somewhat in a final structure. In some embodiments, a plug and/or cap and/or hardmask material includes a layer of a nitride of silicon (e.g., silicon nitride) or a layer of an oxide of silicon, or both, or a combination thereof. Other suitable materials may include carbon-based materials. In another embodiment, a plug and/or cap and/or hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other plug and/or cap and/or hardmask material layers known in the arts may be used depending upon the particular implementation. The plug and/or cap and/or hardmask material layers maybe formed by CVD, PVD, or by other deposition methods.

It is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

Resulting structures may enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select certain of the plugs and vias will likely be very different from the primary ILD and will be perfectly self-aligned in both directions. As such, in an embodiment, offset due to conventional lithograph/dual damascene patterning that must otherwise be tolerated, is not a factor for the resulting structures described herein.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 2:
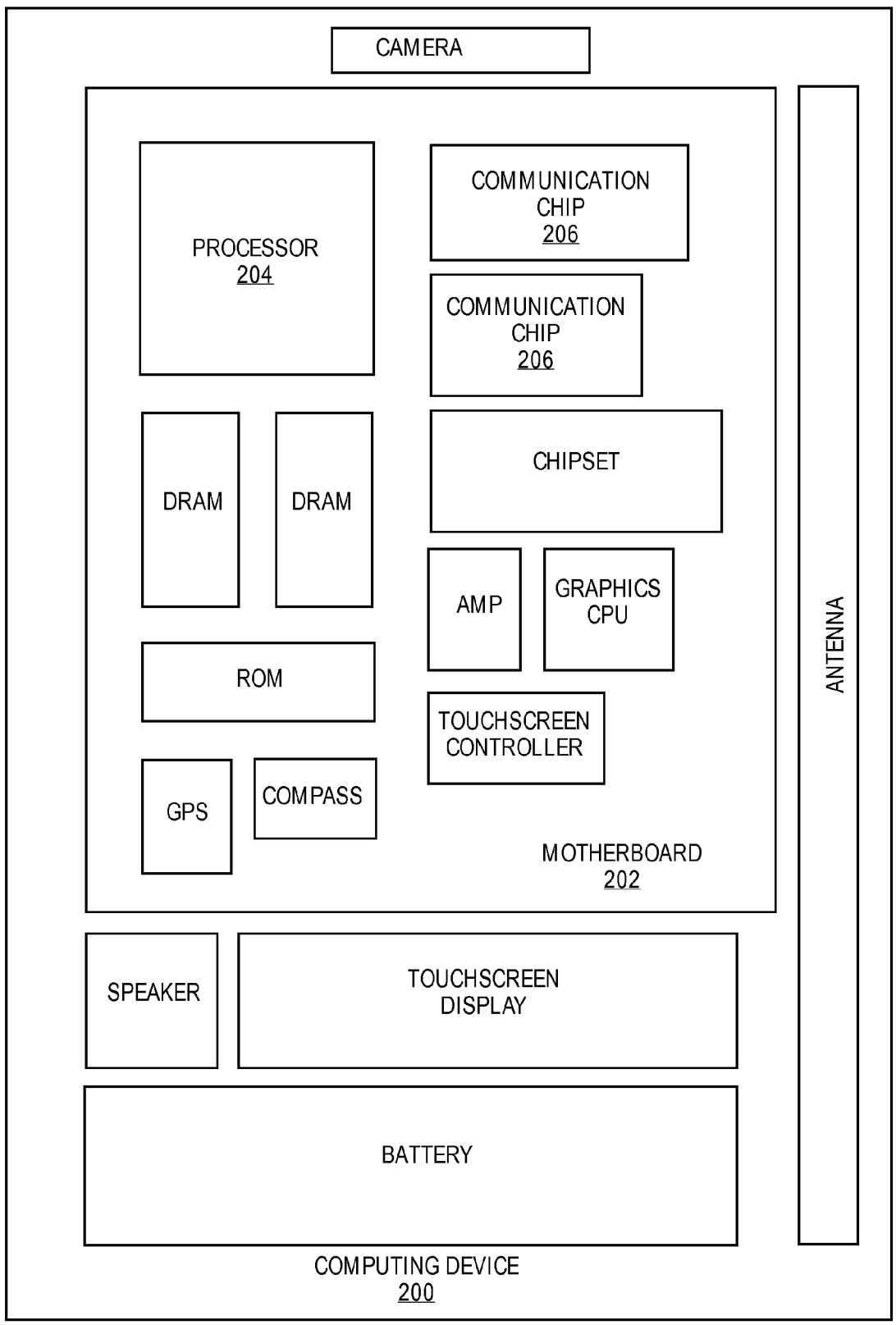
FIG. 2 illustrates a computing device in accordance with one implementation of the invention.

FIG. 2 illustrates a computing device 200 in accordance with one implementation of the invention. The computing device 200 houses a board 202. The board 202 may include a number of components, including but not limited to a processor 204 and at least one communication chip 206. The processor 204 is physically and electrically coupled to the board 202. In some implementations the at least one communication chip 206 is also physically and electrically coupled to the board 202. In further implementations, the communication chip 206 is part of the processor 204.

Depending on its applications, computing device 200 may include other components that may or may not be physically and electrically coupled to the board 202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 206 enables wireless communications for the transfer of data to and from the computing device 200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 200 may include a plurality of communication chips 206. For instance, a first communication chip 206 may be dedicated to shorter range wireless communications such as Wi-Fi and Bluetooth and a second communication chip 206 may be dedicated to longer range wireless communications such as GPS, EDGE, GPRS, CDMA, WiMAX, LTE, Ev-DO, and others.

The processor 204 of the computing device 200 includes an integrated circuit die packaged within the processor 204. In some implementations of the invention, the integrated circuit die of the processor includes one or more structures, such as self-aligned vias and plugs, built in accordance with implementations of the invention. The term "processor" may refer to any device or portion of a device that processes electronic data from registers and/or memory to transform that electronic data into other electronic data that may be stored in registers and/or memory.

The communication chip 206 also includes an integrated circuit die packaged within the communication chip 206. In accordance with another implementation of the invention, the integrated circuit die of the communication chip includes one or more structures, such as self-aligned vias and plugs, built in accordance with implementations of the invention.

In further implementations, another component housed within the computing device 200 may contain an integrated circuit die that includes one or more structures, such as self-aligned vias and plugs, built in accordance with implementations of the invention.

In various implementations, the computing device 200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other electronic device that processes data.

Thus, embodiments of the present invention include self-aligned via and plug patterning using diagonal hardmasks for improved overlay in fabricating back end of line (BEOL) interconnects.

In an embodiment, an interconnect structure for an integrated circuit includes an interlayer dielectric layer disposed above a substrate. A grating structure is disposed above the interlayer dielectric layer and includes co-planar alternating dielectric hardmask lines and conductive lines. One or more of the conductive lines extends into the interlayer dielectric layer, and one or more of the conductive lines does not extend into the interlayer dielectric layer.

In one embodiment, one of the one or more of the conductive lines that extends into the interlayer dielectric layer extends entirely through the interlayer dielectric layer to provide a conductive via to an underlying metallization layer disposed between the substrate and the interlayer dielectric layer.

In one embodiment, one of the one or more of the conductive lines that extends into the interlayer dielectric layer extends only partially into the interlayer dielectric layer to provide a conductive metal line for a metallization layer including the interlayer dielectric layer.

In one embodiment, the grating structure is disposed on the interlayer dielectric layer.

In an embodiment, a method of fabricating an interconnect structure for an integrated circuit involves forming a first hardmask layer above an interlayer dielectric layer disposed above a substrate. The first hardmask layer includes a plurality of first hardmask lines having a first grating in a first direction and comprising one or more sacrificial materials interleaved with the first grating. The method also involves forming a second hardmask layer above the first hardmask layer. The second hardmask layer includes a plurality of second hardmask lines having a second grating in a second direction, diagonal to the first direction. The method also involves, using the second hardmask layer as a mask, etching the first hardmask layer to form a patterned first hardmask layer. The etching involves removing a portion of the one or more sacrificial materials.

In one embodiment, forming the first hardmask layer involves forming the plurality of first hardmask lines using a pitch-halving or pitch-quartering patterning process relative to a minimum critical dimension (CD), and forming the second hardmask layer involves forming the plurality of second hardmask lines at the minimum CD.

In one embodiment, forming the second hardmask layer involves forming the plurality of second hardmask lines having the second grating 45 degrees to the first direction.

In one embodiment, the method further involves removing the second hardmask layer subsequent to etching the first hardmask layer.

In one embodiment, the method further involves, subsequent to removing the second hardmask layer, forming a plurality of photobuckets in the patterned first hardmask, and exposing, developing and removing fewer than all of the plurality of photobuckets to reveal portions of the interlayer dielectric layer, and etching entirely through the revealed portions of the interlayer dielectric layer to form via openings, and forming metal vias in the via openings.

In one embodiment, the method further involves, subsequent to removing the second hardmask layer, forming a plurality of photobuckets in the patterned first hardmask, and exposing, developing and removing fewer than all of the plurality of photobuckets to reveal portions of the interlayer dielectric layer, and etching only partially through the revealed portions of the interlayer dielectric layer to form trenches, and forming metal lines in the trenches.

In one embodiment, the plurality of second hardmask lines is composed of a carbon-based material, and removing the second hardmask layer involves using an ashing process.

In an embodiment, a method of fabricating an interconnect structure for an integrated circuit involves forming a plurality of hardmask lines having a grating pattern above an interlayer dielectric layer disposed above a substrate. The method also involves forming a first plurality of photobuckets interleaved with the plurality of hardmask lines, the first plurality of photobuckets corresponding to a first half of all possible via locations in a metallization layer of the interconnect structure. The method also involves exposing, developing and removing fewer than all of the first plurality of photobuckets to reveal first portions of the interlayer dielectric layer. The method also involves etching entirely through the revealed first portions of the interlayer dielectric layer to form first via openings in the interlayer dielectric layer.

In one embodiment, the method further involves removing all remaining of the first plurality of photobuckets and, subsequently, forming a second plurality of photobuckets interleaved with the plurality of hardmask lines, the second plurality of photobuckets corresponding to a second half of all possible via locations in the metallization layer of the interconnect structure, and exposing, developing and removing fewer than all of the second plurality of photobuckets to reveal second portions of the interlayer dielectric layer, and etching entirely through the revealed second portions of the interlayer dielectric layer to form second via openings in the interlayer dielectric layer.

In one embodiment, the method further involves removing all remaining of the second plurality of photobuckets and, subsequently, forming metal vias in the first and second via openings of the interlayer dielectric layer.

In one embodiment, forming the first plurality of photobuckets interleaved with the plurality of hardmask lines involves forming each of the first plurality of photobuckets to have a nearest neighbor distance of a factor of the square root of two multiplied by a line width of the grating pattern of the plurality of hardmask lines.

In one embodiment, exposing, developing and removing fewer than all of the first plurality of photobuckets involves exposing to extreme ultra-violet (EUV) irradiation.

In an embodiment, a method of fabricating an interconnect structure for an integrated circuit involves forming a plurality of hardmask lines having a grating pattern above an interlayer dielectric layer disposed above a substrate. The method also involves forming a first plurality of photobuckets interleaved with the plurality of hardmask lines, the first plurality of photobuckets corresponding to a first half of all possible plug locations in a metallization layer of the interconnect structure. The method also involves exposing, developing and removing fewer than all of the first plurality of photobuckets to reveal first portions of the interlayer dielectric layer. The method also involves etching only partially through the revealed first portions of the interlayer dielectric layer to form first trenches in the interlayer dielectric layer.

In one embodiment, the method further involves removing all remaining of the first plurality of photobuckets and, subsequently, forming a second plurality of photobuckets interleaved with the plurality of hardmask lines, the second plurality of photobuckets corresponding to a second half of all possible plug locations in the metallization layer of the interconnect structure, and exposing, developing and removing fewer than all of the second plurality of photobuckets to reveal second portions of the interlayer dielectric layer, and etching only partially through the revealed second portions of the interlayer dielectric layer to form second trenches in the interlayer dielectric layer.

In one embodiment, the method further involves removing all remaining of the second plurality of photobuckets and, subsequently, forming metal lines in the first and second trenches of the interlayer dielectric layer.

In one embodiment, forming the first plurality of photobuckets interleaved with the plurality of hardmask lines involves forming each of the first plurality of photobuckets to have a nearest neighbor distance of a factor of the square root of two multiplied by a line width of the grating pattern of the plurality of hardmask lines.

In one embodiment, exposing, developing and removing fewer than all of the first plurality of photobuckets involves exposing to extreme ultra-violet (EUV) irradiation.

What is claimed is:

1. A method of fabricating an interconnect structure for an integrated circuit, the method comprising:
   forming a first hardmask layer above an interlayer dielectric layer disposed above a substrate, the first hardmask layer comprising a plurality of first hardmask lines having a first grating in a first direction and comprising one or more sacrificial materials interleaved with the first grating;
   forming a second hardmask layer above the first hardmask layer, the second hardmask layer comprising a plurality of second hardmask lines having a second grating in a second direction, diagonal to the first direction; and
   using the second hardmask layer as a mask, etching the first hardmask layer to form a patterned first hardmask layer, the etching comprising removing a portion of the one or more sacrificial materials.

2. The method of claim 1, wherein forming the first hardmask layer comprises forming the plurality of first hardmask lines using a pitch-halving or pitch-quartering patterning process relative to a minimum critical dimension (CD), and wherein forming the second hardmask layer comprises forming the plurality of second hardmask lines at the minimum CD.

3. The method of claim 1, wherein forming the second hardmask layer comprises forming the plurality of second hardmask lines having the second grating 45 degrees to the first direction.

4. The method of claim 1, further comprising:
   removing the second hardmask layer subsequent to etching the first hardmask layer.

5. The method of claim 4, further comprising:
   subsequent to removing the second hardmask layer, forming a plurality of photobuckets in the patterned first hardmask;
   exposing, developing and removing fewer than all of the plurality of photobuckets to reveal portions of the interlayer dielectric layer;
   etching entirely through the revealed portions of the interlayer dielectric layer to form via openings; and
   forming metal vias in the via openings.

6. The method of claim 4, further comprising:
   subsequent to removing the second hardmask layer, forming a plurality of photobuckets in the patterned first hardmask;
   exposing, developing and removing fewer than all of the plurality of photobuckets to reveal portions of the interlayer dielectric layer;
   etching only partially through the revealed portions of the interlayer dielectric layer to form trenches; and
   forming metal lines in the trenches.

7. The method of claim 4, wherein the plurality of second hardmask lines comprises a carbon-based material, and wherein removing the second hardmask layer comprises using an ashing process.

8. A method of fabricating an interconnect structure for an integrated circuit, the method comprising:
   forming a plurality of hardmask lines having a grating pattern above an interlayer dielectric layer disposed above a substrate;
   forming a first plurality of photobuckets interleaved with the plurality of hardmask lines, the first plurality of photobuckets corresponding to a first half of all possible via locations in a metallization layer of the interconnect structure;
   exposing, developing and removing fewer than all of the first plurality of photobuckets to reveal first portions of the interlayer dielectric layer; and
   etching entirely through the revealed first portions of the interlayer dielectric layer to form first via openings in the interlayer dielectric layer.

9. The method of claim 8, further comprising:
   removing all remaining of the first plurality of photobuckets; and, subsequently,
   forming a second plurality of photobuckets interleaved with the plurality of hardmask lines, the second plurality of photobuckets corresponding to a second half of all possible via locations in the metallization layer of the interconnect structure;
   exposing, developing and removing fewer than all of the second plurality of photobuckets to reveal second portions of the interlayer dielectric layer; and
   etching entirely through the revealed second portions of the interlayer dielectric layer to form second via openings in the interlayer dielectric layer.

10. The method of claim 9, further comprising:
    removing all remaining of the second plurality of photobuckets; and, subsequently, forming metal vias in the first and second via openings of the interlayer dielectric layer.

11. The method of claim 8, wherein forming the first plurality of photobuckets interleaved with the plurality of hardmask lines comprises forming each of the first plurality of photobuckets to have a nearest neighbor distance of a factor of the square root of two multiplied by a line width of the grating pattern of the plurality of hardmask lines.

12. The method of claim 8, wherein exposing, developing and removing fewer than all of the first plurality of photobuckets comprises exposing to extreme ultraviolet (EUV) irradiation.

13. A method of fabricating an interconnect structure for an integrated circuit, the method comprising:
    forming a plurality of hardmask lines having a grating pattern above an interlayer dielectric layer disposed above a substrate;
    forming a first plurality of photobuckets interleaved with the plurality of hardmask lines, the first plurality of photobuckets corresponding to a first half of all possible plug locations in a metallization layer of the interconnect structure;
    exposing, developing and removing fewer than all of the first plurality of photobuckets to reveal first portions of the interlayer dielectric layer; and
    etching only partially through the revealed first portions of the interlayer dielectric layer to form first trenches in the interlayer dielectric layer.

14. The method of claim 13, further comprising:
    removing all remaining of the first plurality of photobuckets; and, subsequently,
    forming a second plurality of photobuckets interleaved with the plurality of hardmask lines, the second plurality of photobuckets corresponding to a second half of all possible plug locations in the metallization layer of the interconnect structure;

exposing, developing and removing fewer than all of the second plurality of photobuckets to reveal second portions of the interlayer dielectric layer; and etching only partially through the revealed second portions of the interlayer dielectric layer to form second trenches in the interlayer dielectric layer.

15. The method of claim 14, further comprising:

removing all remaining of the second plurality of photobuckets; and, subsequently, forming metal lines in the first and second trenches of the interlayer dielectric layer.

16. The method of claim 13, wherein forming the first plurality of photobuckets interleaved with the plurality of hardmask lines comprises forming each of the first plurality of photobuckets to have a nearest neighbor distance of a factor of the square root of two multiplied by a line width of the grating pattern of the plurality of hardmask lines.

17. The method of claim 13, wherein exposing, developing and removing fewer than all of the first plurality of photobuckets comprises exposing to extreme ultraviolet (EUV) irradiation.

* * * * *